(12) United States Patent
Moriya et al.

(10) Patent No.: US 7,622,385 B2
(45) Date of Patent: Nov. 24, 2009

(54) WIRING PATTERN FORMING METHOD, FILM PATTERN FORMING METHOD, SEMICONDUCTOR DEVICE, ELECTRO-OPTICAL DEVICE, AND ELECTRONIC EQUIPMENT

(75) Inventors: Katsuyuki Moriya, Toyoshina-machi (JP); Toshimitsu Hirai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 416 days.

(21) Appl. No.: 11/242,009

(22) Filed: Oct. 4, 2005

(65) Prior Publication Data
US 2006/0088998 A1 Apr. 27, 2006

(30) Foreign Application Priority Data
Oct. 27, 2004 (JP) ............................. 2004-311854

(51) Int. Cl.
*H01L 21/44* (2006.01)
(52) U.S. Cl. .................. 438/674; 438/584; 257/98; 257/E33.044; 257/E21.58
(58) Field of Classification Search ................ 438/674, 438/34, 584, 427; 257/98, E21.58, E21.586, 257/E21.588, E21.489, E21.49, E21.582, 257/E33.044
See application file for complete search history.

(56) References Cited

U.S. PATENT DOCUMENTS

| | | | | |
|---|---|---|---|---|
| 5,329,695 A | * | 7/1994 | Traskos et al. ................ 29/830 |
| 5,587,342 A | * | 12/1996 | Lin et al. .................... 438/125 |
| 5,832,595 A | * | 11/1998 | Maruyama et al. ............. 29/829 |
| 6,946,159 B2 | * | 9/2005 | Takahashi et al. .............. 427/77 |
| 7,109,107 B2 | * | 9/2006 | Prather et al. ................ 438/614 |
| 2003/0059987 A1 | * | 3/2003 | Sirringhaus et al. .......... 438/149 |
| 2005/0122351 A1 | * | 6/2005 | Yamazaki et al. ................ 347/5 |
| 2006/0063111 A1 | * | 3/2006 | Ali et al. ..................... 430/322 |
| 2007/0173053 A1 | * | 7/2007 | Fukuchi ...................... 438/622 |

FOREIGN PATENT DOCUMENTS

| | | | |
|---|---|---|---|
| JP | 02-132831 | | 5/1990 |
| JP | 05-006942 | | 1/1993 |
| JP | 08-250590 | | 9/1996 |
| JP | 10-313009 | | 11/1998 |
| JP | 11-095024 | * | 4/1999 |
| JP | 11-274671 | | 10/1999 |
| JP | 2000-353594 | | 12/2000 |
| JP | 2003043243 | * | 2/2003 |
| JP | 2003-139935 | * | 5/2003 |
| JP | 2003-273111 | | 9/2003 |
| JP | 2003-317945 | | 11/2003 |
| KR | 10-2004-0023758 A | | 3/2004 |
| KR | 10-2004-0030304 A | | 4/2004 |

* cited by examiner

*Primary Examiner*—Caridad M Everhart
(74) *Attorney, Agent, or Firm*—Oliff & Berridge, PLC

(57) ABSTRACT

A wiring pattern forming method which is a method of forming a wiring pattern by using a liquid droplet ejection method on a preset area on a substrate, includes:
forming a bank on the preset area on the substrate;
ejecting a functional liquid including a wiring pattern material on an area surrounded by the bank and drying the functional liquid to form the wiring pattern; and
removing part of the bank so as to make a height of the bank and a thickness of the wiring pattern approximately the same.

10 Claims, 16 Drawing Sheets

WIRING PATTERN FORMING METHOD, FILM PATTERN FORMING METHOD, SEMICONDUCTOR DEVICE, ELECTRO-OPTICAL DEVICE, AND ELECTRONIC EQUIPMENT

This application claims the benefit of Japanese Patent Application No. 2004-311854 filed on Oct. 27, 2004. The entire disclosure of the prior application is herby incorporated by reference herein its entirety.

BACKGROUND OF THE INVENTION

1. Technical Field

The invention relates to a wiring pattern forming method, and a semiconductor device provided with a wiring pattern manufactured by using a circuit wiring forming method, an electro-optical device, and electronic equipment, and a film pattern forming method.

2. Related Art

The semiconductor device is formed such that circuit wiring on which a thin film (hereinafter referred to as the "wiring film") made up of a conductor is arranged is layered over a thin film such as an insulation film covering the circuit wiring. For an efficient forming method of circuit wiring and a thin film, there is known a so-called inkjet method in which a functional liquid including a thin film material such as disclosed in JP-A-11-274671 as a solute is ejected from a liquid droplet ejection head, and the impacted functional liquid is dried to form the circuit wiring and the thin film excepting a solvent.

In the inkjet method, the circuit wiring has a bank arranged on a substrate, forming a concavity surrounded by the bank which is as flat-shaped as the circuit wiring, whereby the functional liquid is spewed out, so that by drying the functional liquid, which was spewed out and impacted on the concavity, and forming a wiring film, any shape is formed.

Further, in a device such as a semiconductor device which is formed as the circuit wiring and the thin film are layered over, resulting from a step between the circuit wiring and its periphery, a defect may occur on the thin film layered over the circuit wiring. To prevent the defect, there is proposed a method of leveling the step between the circuit wiring and the periphery as described in JP-A-2-132831.

JP-A-11-274671 is a first example of related art. JP-A-2-132831 is a second example of related art.

However, as shown in FIG. 19A, it is desirable for a liquid droplet 501, which was spewed out so as to impact a concavity 534, to enter the concavity 534 like a functional liquid 502 shown in FIG. 19B. Yet, like a functional liquid 503 shown in FIG. 19B, part thereof may be deposited on an upper surface of a bank B.

As shown in FIG. 19C, when forming a wiring film 504 through drying the functional liquid 502, the functional liquid 503 is also dried, whereby there may be formed a bulge 506, as the functional liquid 503 is dried to cause the wiring film 504 to be bulged out onto a cornered portion of the bank B, and a residue 507 of a wiring material of a solute of the functional liquid 503 may remain on the bank B.

Further, when the insulation film 510 covering the wiring film 504 is formed on the wiring film 504 and the bank B, as shown in FIG. 19D, at a step portion resulting from a difference in a thickness of the wiring film 504 and a thickness of the bank B, a step is also created in the insulation film 510. Since a thickness direction of the thin film increases in a stacking direction of the thin film shown by arrow Z in FIG. 19D, it will not grow in a direction perpendicular to the arrow Z. Consequently, a thin film part 511 where the insulation film 510 became thin was formed at the step portion. The following problems occurred resulting from these.

Problem 1

To prevent the wiring material from diffusing to the insulation film 510 covering the wiring film 504, the bank B, and the like, as shown in FIG. 19D, there is employed a method of providing a diffusion-preventing film 512 covering the wiring film 504. But, the residue 507 remaining on the bank B cannot be covered by the diffusion-preventing film 512, so that the wiring material may diffuse to the insulation film 510 and the like.

Problem 2

Likewise, the bulge 506 caused by the wiring film 504 as it bulged out onto the cornered portion of the bank B, cannot be covered by the diffusion-preventing film 512, hence, the wiring material may disffuse to the insulation film 510 and the like.

Problem 3

At the thin film part 511 where the insulation film 510 became thin at the step portion, insulating function of the insulation film 510 may not be sufficient at times. Consequently, as shown in FIG. 19E, when another wiring film 515 and a conductive layer of a semiconductor device are formed on the insulation film 510, there is an increased possibility of generating a defect such as a short-circuit between the wiring film 504 and the insulation film 515 and the conductor of the semiconductor device at the thin film part 511.

Problem 4

As shown in FIG. 19E, when there exists the bulge 506 caused by the wiring film 504 as it bulged out onto the cornered portion of the bank B, together with the thin film part 511 where the insulation film 510 became thin at the step portion, the bulge 506 and the thin film part 511 exist in mutual proximity in the vicinity of the step portion. This increases a possibility of generating a defect such as a short-circuit between the wiring film 504 and the wiring film 515 and the conductive layer of the semiconductor device through the bulge 506.

When the wiring material diffuses to the insulation film and the like, a change occurs in the function of the insulation film and the like, so that performance of the insulation film and the like as well as performance of the semiconductor device including the wiring film and the insulation film may deteriorate. Hence, that the wiring material diffuses to the insulation film and the like poses a serious problem.

SUMMARY

An advantage of some aspects of the invention is to provide a wiring pattern forming method, a film pattern forming method, a semiconductor device, an electro-optical device, and electronic equipment, which can restrain deterioration of performance of the semiconductor device and the like resulting from diffusion of a wiring material to an insulation film and the like, and which can restrain a short-circuit between circuit wiring and other circuit wiring and a conductive layer of the semiconductor device.

According to a first aspect of the invention, a wiring pattern forming method is a method of forming a wiring pattern by using a liquid droplet ejection method on a preset area on a substrate, which includes: forming a bank on the preset area on the substrate; ejecting a functional liquid including a wiring pattern material on an area surrounded by the bank and drying the functional liquid to form the wiring pattern; and removing part of the bank so as to make a height of a bank and a thickness of the wiring pattern approximately the same.

According to a second aspect of the invention, the wiring pattern forming method is the method of forming a wiring pattern by using the liquid droplet ejection method on the preset area on the substrate, which includes: forming a bank in a manner of surrounding the preset area on the substrate; ejecting a first functional liquid on the area surrounded by the bank and drying the first functional liquid to form a first wiring pattern; ejecting a second functional liquid on the first wiring pattern and drying the second functional liquid to form a second wiring pattern; and removing part of the bank so that the height of the bank and the thickness of the wiring pattern, in which the first wiring pattern and the second wiring pattern are layered over, may become approximately the same.

According to a method of the invention, by removing part of the bank, the thickness of the bank is made approximately the same as the thickness of the wiring pattern or the total thickness of the layered-over wiring patterns.

As a result, restraint of the step portion between the bank and the wiring pattern from growing makes it possible to restrain a thin film, which is to be formed on the bank and the wiring pattern, from becoming thinner. Consequently, it is possible to restrain generation of a short-circuit resulting from thinning of the insulation film 28, when the wiring pattern comes in contact with other thin film layers which are separated by the thin film.

By removing part of the bank, any wiring material bulged out onto the bank may also be removed. Namely, since the wiring material placed on a border between the bank, which has a relatively high possibility of the thin film becoming thinner, and the wiring pattern, is removed, it is possible to restrain further generation of a short-circuit and the like resulting from the thinning of the insulation film 28, when the wiring pattern separated through the thin film from other thin film layers come in contact with each other.

According to a third aspect of the invention, the wiring pattern forming method is the method of forming a wiring pattern by using the liquid droplet ejection method on the preset area on the substrate, which includes: forming a bank in a manner of surrounding the preset area on the substrate; ejecting a first functional liquid on the area surrounded by the bank and drying the first functional liquid to form a first wiring pattern; removing part of the bank and part of the first wiring pattern so that the thickness of the bank may become thicker than the thickness of the first wiring pattern; forming a diffusion prevention layer which prevents the material from diffusing onto the first wiring pattern; and removing part of the bank so that the height of the bank and the thickness of the wiring pattern, in which the first wiring pattern and the diffusion prevention layer are layered over, may become approximately the same.

According to a fourth aspect of the invention, the wiring pattern forming method is the method of forming a wiring pattern by using the liquid droplet ejection method on the preset area on the substrate, which includes: forming a bank in a manner of surrounding the preset area on the substrate; ejecting a first functional liquid including a material of a first wiring pattern on the area surrounded by the bank and drying the first functional liquid to form the first wiring pattern; removing part of the bank and part of the first wiring pattern so that the thickness of the bank may become thicker than the thickness of the first wiring pattern after forming the first wiring pattern a plurality of times; forming a diffusion prevention layer to prevent a material from diffusing onto the first wiring pattern; and removing part of the bank so that the height of the bank and the thickness of the wiring pattern, in which the first wiring pattern and the diffusion prevention layer are layered over, may become approximately the same.

According to the method of the invention, by removing part of the bank and part of the wiring pattern so that the thickness of the bank may become thicker than the thickness of the wiring pattern or the total thickness of the layered-over wiring patterns, the wiring material bulged out onto the bank and the residue of the wiring material remaining on the bank are eliminated, thus enabling the wiring pattern not covered by the diffusion preventing film and the wiring material to be nearly removed. This makes it possible to restrain the wiring material from diffusing to the thin film formed to cover the bank and the wiring pattern. Namely, it is possible to restrain deterioration of the performance of the semiconductor device and the like resulting from diffusion of the wiring material onto the insulation film.

Further, by forming the diffusion preventing film on the wiring pattern which became lower than the upper surface of the bank, a step between the upper surface of the bank and the upper surface of the diffusion preventing film is reduced, thereby restraining the step portion between the upper surface of the bank and the upper surface of the diffusion preventing film from growing. Hence, it is possible to restrain a thin film to be formed on the bank and the wiring pattern from getting thin at the step portion.

Consequently, it is possible to restrain the generation of a short-circuit and the like resulting from the thinning of the insulation film 28, when the wiring pattern comes in contact with another thin film layer separated through a thin film.

In this case, it is preferable that the step of removing part of the bank be carried out in half-etching.

According to this method, half-etching removes the thin film from the surface to the middle in a thickness direction of the thin film, hence, it is possible to reduce the thickness of the bank to an appropriate thickness.

In this case, it is preferable that the material forming the bank be an inorganic resin.

According to this method, because the inorganic resin is heat-resistant, a bank having excellent heat resistance can be formed. Excellent heat resistance of the bank makes it possible to carry out processing which requires the bank to be exposed to a high-temperature environment without affecting the bank in a process of forming a thin film and the like on a concavity between the banks and on the bank.

In a semiconductor device according to an aspect of the invention, a wiring pattern is formed using a wiring pattern forming method described in the claim.

According to a construction of the invention, it is possible to restrain the wiring material from diffusing onto the thin film formed in a manner of covering the bank and the wiring pattern. At the same time, since it has a wiring pattern formed by using a wiring pattern forming method capable of restraining the generation of a short-circuit when the wiring film comes in contact with another thin film layer separated by a thin film, there is little possibility of the deterioration of performance caused by diffusion of the wiring material of the wiring pattern onto the insulation film and the like.

At the same time, there is little possibility of a defect such as a short-circuit to occur resulting from the wiring pattern coming in contact with other circuit wiring and thin film layers. Therefore, a semiconductor device of high reliability can be realized.

An electro-optical device according to an aspect of the invention is equipped with a semiconductor device according to the claim.

According to the construction of the invention, there is little possibility of the deterioration of performance caused by diffusion of the wiring material of the wiring pattern onto the insulation film and the like. At the same time, because there is provided a semiconductor device having little possibility of a defect such as a short-circuit to occur resulting from the wiring pattern coming in contact with other circuit wiring and thin film layers. Therefore, an electro-optical device of high reliability can be realized.

It should be noted that as the electro-optical device, there are considered a liquid crystal display, an organic EL (Electro-Luminescence) device, an electron discharge device, a PDP (Plasma Display Panel) device and an electrophoretic display device and the like. Further, the electron discharge device represents a concept including a so-called FED (Field Emission Display) device.

The electronic equipment according to an aspect of the invention includes an electro-optical device according to the claim.

According to the construction of the invention, while there is little deterioration of performance caused by the wiring material of the wiring pattern diffusing to the insulation film and the like, there is little possibility of a defect such as a short-circuit resulting from the wiring pattern coming into contact with other circuit wiring and thin film layers. Therefore, because an electro-optical device of high reliability is mounted, electronic equipment of high reliability can be realized.

As electronic equipment, there are a mobile phone mounted with a so-called "flat panel display," a personal computer and various types of other electric products.

A film pattern forming method according to the invention which is a method of forming a film pattern on a preset area on a substrate, includes: forming a bank on the preset area on the substrate; ejecting a functional liquid including a film pattern material on an area surrounded by the bank; drying the functional liquid to form the film pattern; and removing part of the bank so as to make a height of the bank and a thickness of the film pattern approximately the same.

The film pattern forming method according to the invention which is the method of forming a film pattern by using the liquid droplet ejection method on the preset area on the substrate, includes: forming a bank in a manner of surrounding the preset area on the substrate; ejecting a first functional liquid on the area surrounded by the bank and drying the first functional liquid to form a first film pattern; ejecting a second functional liquid on the first film pattern and drying the second functional liquid to form a second film pattern; and removing part of the bank so that the height of the bank and the thickness of the film pattern, in which the first film pattern and the second film pattern are layered over, may become approximately the same.

After forming the film pattern, by subjecting the bank to half-etching so as to make the film pattern and the bank approximately level, it is possible to form the film to be formed on the film pattern and the bank. Further, it is possible to make the film to be formed easily on the film pattern and the bank into a film which is approximately level with a uniform thickness.

BRIEF DESCRIPTION OF THE DRAWINGS

The invention will be described with reference to the accompanying drawings, wherein like numbers refer to like elements, and wherein.

DESCRIPTION OF THE EMBODIMENTS

Figure 1:
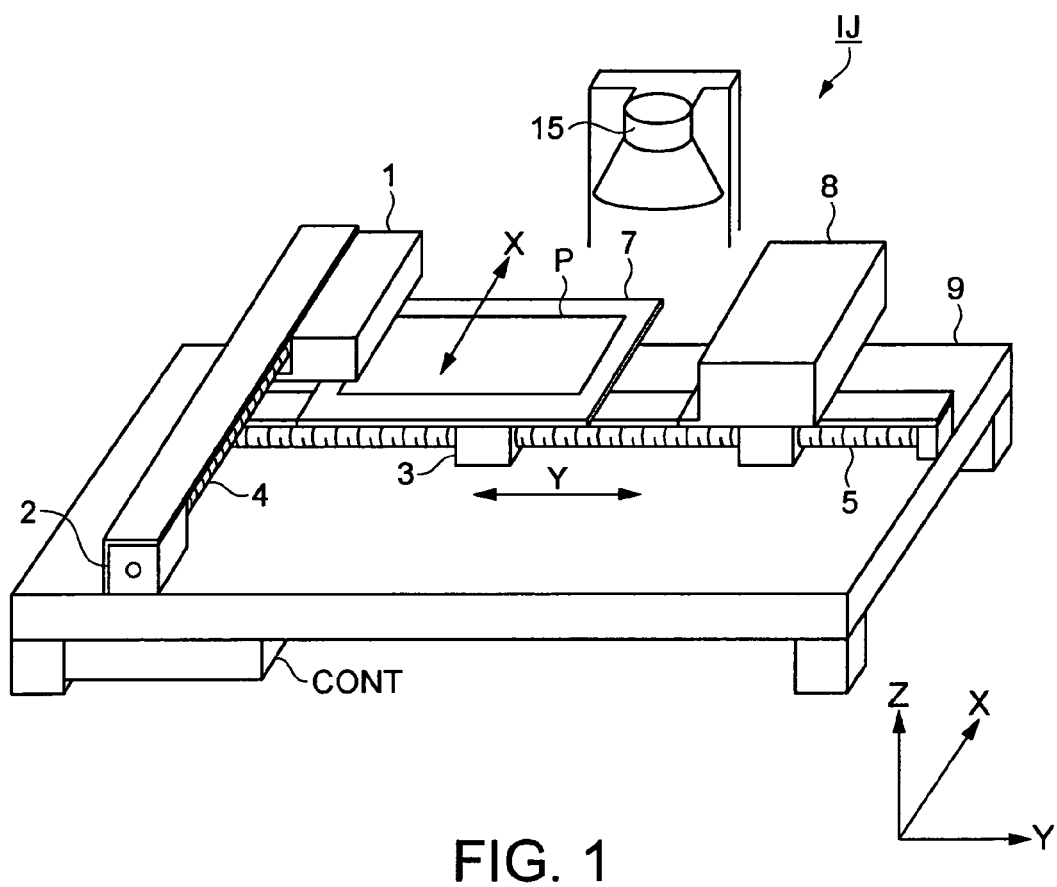
FIG. 1 is a perspective view showing a schematic construction of a liquid droplet ejection device IJ.

An embodiment of a wiring pattern forming method according to the invention will now be described with reference to the drawings. In the following drawings, a reduced scale of each member and each layer is changed as necessary so that a size of each member and each layer is made sufficiently large to be recognizable.

First Embodiment

In the embodiment, description will be made by using an example of a case where ink (functional liquid) for forming a wiring pattern (wiring film) including minute conductive particles is ejected in liquid droplets from ejection nozzles of a liquid droplet ejection head according to a liquid droplet ejection method, whereby a wiring pattern is formed on a substrate.

First, the ink to be used (functional liquid) will be described. The ink for wiring pattern formation which is a liquid material is composed of a dispersed liquid in which minute conductive particles are dispersed in disperse media. In the embodiment, as minute conductive particles, there are used, for example, minute metallic particles containing at least one of gold, silver, copper, aluminum, palladium, and nickel as well as minute particles of these oxides, conductive polymers and superconductors.

These minute metallic particles may also be used with their surfaces being treated with a coating of an organic matter and the like to improve dispersibility. It is preferable for a particle diameter of the minute conductive particle to be more than 1 nm and less than 0.1 μm.

A size larger than 0.1 μm may cause to clog the ejection nozzles of the liquid droplet ejection head. Further, a size less than 1 nm will increase a volume ratio of a coating agent with respect to the minute conductive particles, thus making a ratio of organic matter in the film obtained excessively large.

For the disperse medium, there are no particular restrictions so long as it can disperse the above-referenced minute conductive particles and causes no coagulation. For example, there may be illustrated, in addition to water, alcohol such as methanol, ethanol, propanol, and butanol, hydrocarbon compounds such as n-heptane, n-octane, decan, dodecan, tetradecan, toluene, xylene, cymene, durene, indene, dipentene, tetrahydronaphthalene, decahydronaphthalene, and cyclohexylbenzene, ether compounds such as ethylenegly-coldimethylether, ethyleneglycoldiethylether, ethyleneglycolmethylethylether, diethyleneglycoldimethylether, diethyleneglycoldiethyether, diethyleneglycolmethylethylether, 1,2-dimethoxyethane, bis (2-methoxyethyl)ether, and p-dioxane, and further polar compounds such as propylenecarbonate, γ-butyrolactone, N-methyl-2-pyrolidon, dimethylformamide, dimethylsurufoxide, and cyclohexanone.

Of these, water, alcohol, hydrocarbon compounds, and ether compounds are preferable in terms of dispersibility of minute particles and stability of a dispersed liquid, and ease of application to the liquid droplet ejection method. As more preferable diffusion media, water and hydrocarbon compounds may be cited.

It is preferable that a surface tension of a dispersed liquid of the above-referenced minute conductive particles be within a range of more than 0.02 N/m and less than 0.07 N/m. When ejecting the ink through the liquid droplet ejection method, if the surface tension is less than 0.02 N/m, wettability of the ink to a nozzle surface increases, so that a flight curve tends to occur. If it exceeds 0.07 N/m, a shape of a meniscus at a nozzle tip does not stabilize, hence, control of an ejection volume and ejection timing become difficult.

To adjust surface tension, a minute quantity of a surface tension adjusting agent such as fluoride, silicide, and nonionic types may be added to the above-referenced dispersed liquid within a range of not appreciably lowering a contact angle with the substrate. The nonionic surface tension adjusting agent contributes to increasing the ink's wettability to the substrate, improving leveling capacity of the film, and preventing generation of minute concavity and convexity of the film. The surface tension adjusting agent may include, as necessary, an organic compound such as alcohol, ether, ester and ketone.

It is preferable that viscosity of the dispersed liquid be more than 1 MPa·s and less than 50 mPa·s. When ejecting the ink as the liquid droplet by using the liquid droplet ejection method, if its viscosity is less than 1 mPa·s, the nozzle's periphery tends to be contaminated by an outflow of the ink. Further, if its viscosity exceeds 50 mPa·s, clogging frequency of nozzle holes increases to make smooth ejection of the liquid droplet difficult.

As the substrate on which the wiring pattern is formed, various materials such as glass, quartz glass, silicon wafers, plastic films, and metallic plates may be used. Further, there are included those materials having films such as a semiconductor film, a metallic film, a dielectric film and an organic film which are formed as an undercoat layer on the surface of these base materials.

At this time, as an ejection technique of the liquid droplet ejection method, there may be cited a charge control system, a pressurized vibration system, an electromechanical conversion system, an electric heat conversion system, an electrostatic suction system and the like. The charge control system provides a charge to the material with a charge electrode, controlling a flight direction of the material by a deflection electrode and making the ejection nozzle eject.

Further, the pressurized vibration system causes a nozzle tip side to eject the material by impressing a super high voltage of approximately 30 kg/cm$^2$ upon the material. If no control voltage is applied, the material moves straight forward to be ejected from the ejection nozzle, while an electrostatic repulsion occurs among the materials upon application of the control voltage to make the material fly, so that no ejection from the ejection nozzle occurs.

Still further, the electromechanical conversion system is based on utilizing a property of a piezoelectric element to be deformed upon receipt of a pulse electric signal. As the piezoelectric element is deformed, pressure is applied through a flexible matter, to a space which stored the material, whereafter the material is pushed out of this space to be ejected from the ejection nozzle.

Furthermore, the electric heat conversion system generates a bubble by evaporating the material rapidly through a heater set up in the space where the material is stored, ejecting the material in the space through pressure of the bubble. The electrostatic suction system applies minute pressure inside the space in which the material is stored, forming the meniscus of the material on the ejection nozzle, while applying electrostatic attraction in this state and pulling out the material.

Additionally applicable are techniques such as a system of using viscosity change of a fluid in an electric field and a system of flying electric discharge sparks.

The liquid droplet ejection method has little waste in the use of the material, with an added advantage of being able to place the desired amount precisely at a desired position. Note that the quantity of one drop of the liquid material to be ejected by the liquid droplet ejection method is, for example, 1 to 300 nano-grams.

Next, a device manufacturing unit used when manufacturing a device according to the invention will be described. For this device manufacturing unit, there is used a liquid droplet ejection device (inkjet device) which manufactures a device by ejecting (dripping) a liquid droplet from the liquid droplet ejection head to the substrate.

FIG. 1 is a perspective showing a schematic construction of a liquid droplet ejection device IJ. In FIG. 1, the liquid droplet ejection device IJ is composed of a liquid droplet ejection head 1, an x-axis direction drive shaft 4, a y-axis direction drive shaft 5, a control CONT, a stage 7, a cleaning mechanism 8, a bed 9, and a heater 15.

The stage 7 supports a substrate P, on which the ink is arranged by this liquid droplet ejection device IJ. It is equipped with an un-illustrated fixing mechanism which fixes the substrate P to a reference position.

The liquid droplet ejection head 1 is a liquid droplet ejection head of a multi-nozzle type equipped with a plurality of ejection nozzles with its length direction and the x-axis direction in agreement. The plurality of the ejection nozzles are provided on the lower surface of the liquid droplet ejection head 1 at a fixed pitch in a row in the x-axis direction. From the ejection nozzles of the liquid droplet ejection head 1 is ejected ink containing the above-referenced minute conductive particles towards the substrate P supported by the stage 7.

An x-axis direction drive motor 2 is coupled to the x-axis direction drive shaft 4. The x-axis direction drive motor 2 is a stepping motor and the like, and when a drive signal of the x-axis direction is supplied from the control CONT, it revolves the x-axis direction drive shaft 4. When the x-axis direction drive shaft 4 revolves, the liquid droplet ejection head 1 shifts in the x-axis direction.

The y-axis direction drive shaft 5 is fixed so as to make it stationary with respect to the bed 9. The stage 7 is equipped with a y-axis direction drive motor 3. The y-axis direction drive motor 3 is a stepping motor and the like, and when a drive signal of the y-axis direction is supplied from the control CONT, it shifts the stage 7 in the y-axis direction.

The control CONT supplies a voltage for liquid droplet ejection control to the liquid droplet ejection head 1. Further, the control CONT supplies a drive pulse signal to control a shift of the liquid droplet ejection head 1 in the x-axis direction with respect to the x-axis direction drive motor 2, while, at the same time, supplying a drive pulse signal to control a shift of the stage 7 in the y-axis direction with respect to the y-axis direction drive motor 3.

The cleaning mechanism 8 is for cleaning the liquid droplet ejection head 1 and is provided with the un-illustrated y-axis direction drive motor. Through drive of this y-axis direction drive motor, the cleaning mechanism 8 shifts along the y-axis direction guide shaft 5. Shift of the cleaning mechanism 8 is also controlled by the control CONT.

The heater 15 herein provides a method of heat-treating the substrate P by lamp anneal, carrying out evaporation and drying of a solvent contained in the ink coated on the substrate P. Making and breaking the power source of this heater 15 is controlled by the control CONT.

The liquid droplet ejection device IJ ejects a liquid droplet onto the substrate P while scanning relatively with the stage 7 which supports the liquid droplet ejection head 1 and the substrate P. At this point, in the following description, the y-axis direction is set as a scanning direction, and the x-axis direction intersecting perpendicularly the y-axis direction is set as a non-scanning direction.

Accordingly, the ejection nozzles of the liquid droplet ejection head 1 are provided at a fixed pitch in a row in the x-axis direction. It should be noted that although in FIG. 1, the liquid droplet ejection head 1 is arranged at a right angle to the advancing direction of the substrate P, an angle of the liquid droplet ejection head 1 may be adjusted such as to intersect the advancing direction of the substrate P. By adjusting the angle of the liquid droplet ejection head 1 in such a way, it is possible to adjust the pitch among nozzles. Further, a distance between the substrate P and the nozzle surface may be made freely adjustable.

Figure 2:
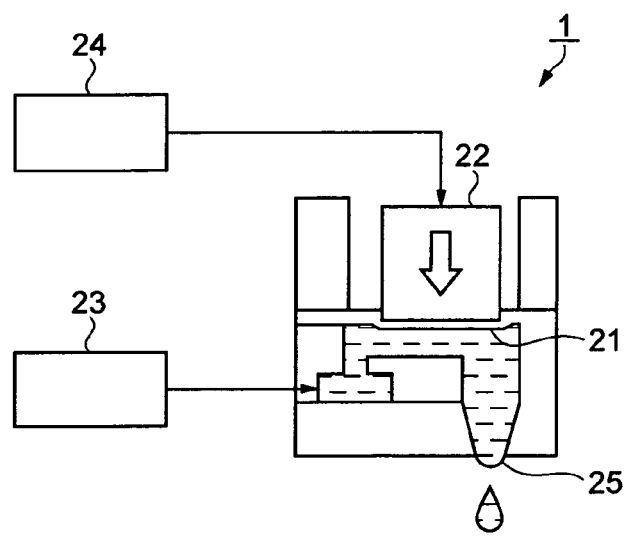
FIG. 2 is a schematic section explaining an ejection principle of a liquid material through a piezzo-electric system.

FIG. 2 is a diagram to explain an ejection principle of a liquid material according to the piezo-electric method. In FIG. 2, a piezo-electric element 22 is set up adjacent to a liquid chamber 21 storing the liquid material (ink for forming the wiring pattern, functional liquid). In the liquid chamber 21, the liquid material is supplied through a liquid material supply system 23 including a material tank storing the liquid material.

The piezo-electric element 22 is connected to the drive circuit 24, and through this drive circuit 24 a voltage is impressed on the piezo-electric element 22. By deforming the piezo-electric element 22, the liquid chamber 21 is deformed, thereby ejecting the liquid material from the ejection nozzle 25.

In this case, by changing a value of the impressed voltage, a quantity of distortion of the piezo-electric element 22 can be controlled. Further, by changing a frequency of the impressed voltage, a distortion rate of the piezo-electric element 22 can be controlled. Since liquid droplet ejection through the piezo-electric method does not apply heat to the material, there is an advantage of hardly affecting composition of the material.

Figure 3:
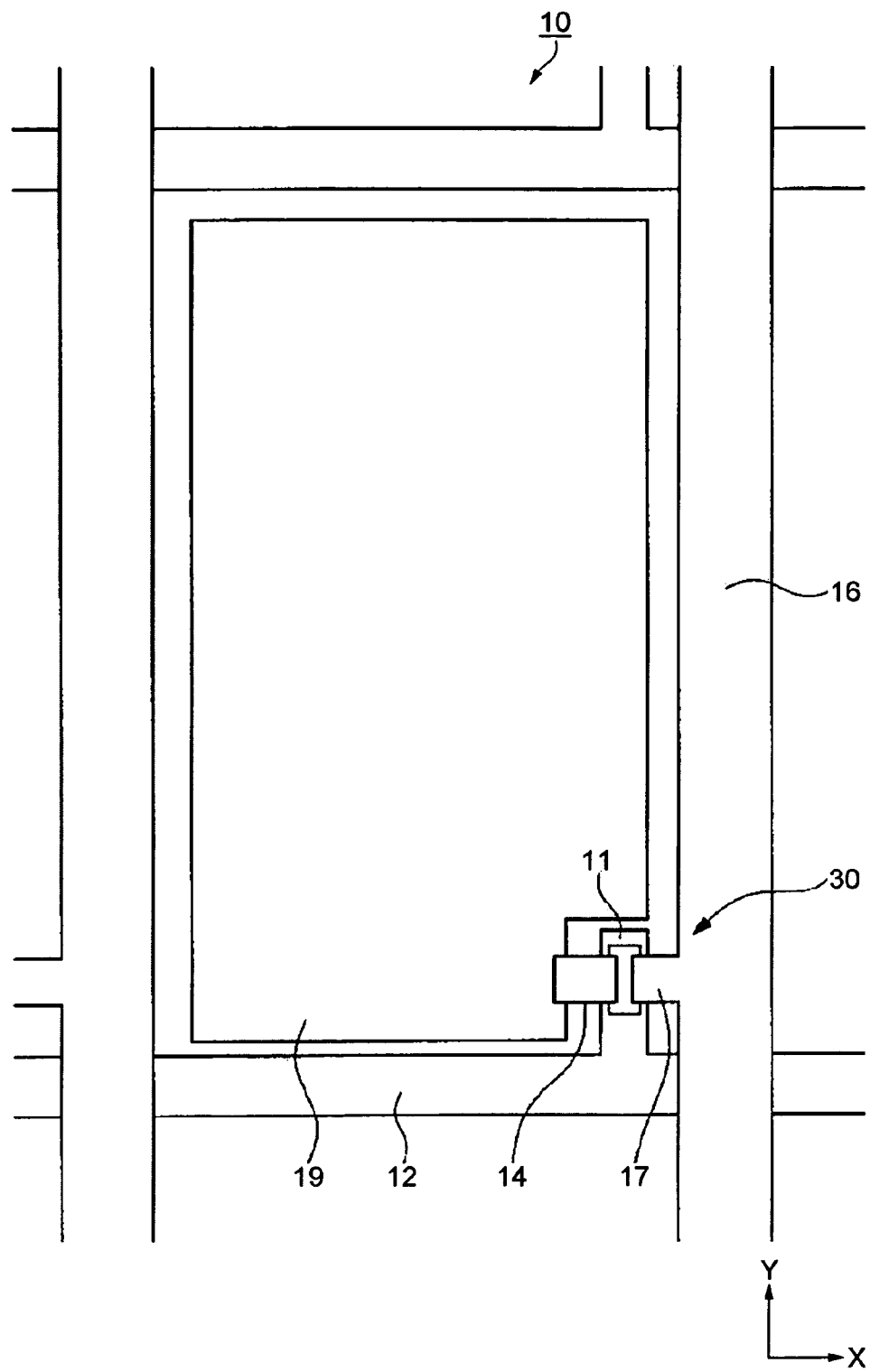
FIG. 3 is a plan view showing a schematic construction of a principal part of a TFT array substrate.
Figure 4A:
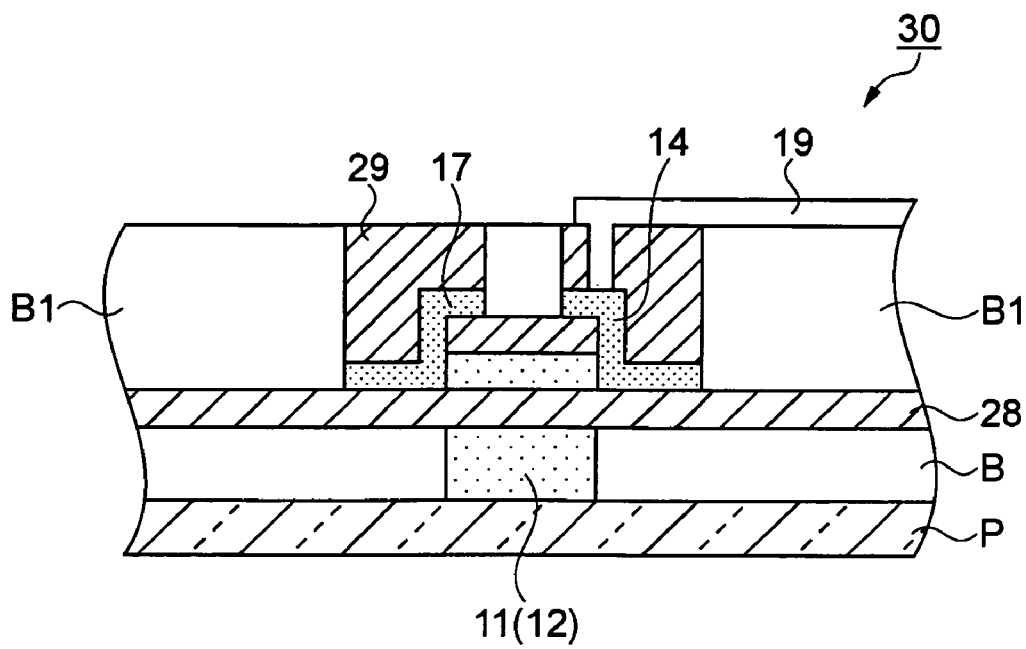
FIG. 4A is a section of a TFT and FIG. 4B is a section of a part in which gate wiring and source wiring intersect in planar terms.
Figure 4B:
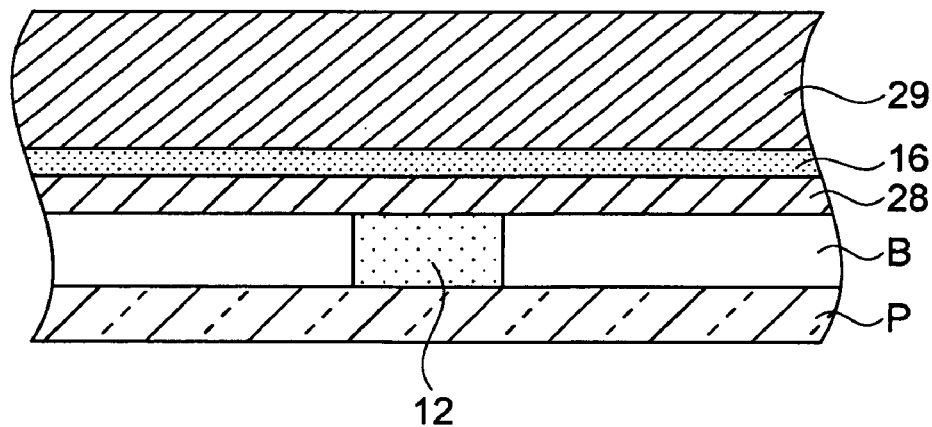

Next, a thin film transistor (TFT) which is an example of a device manufactured by using the wiring pattern forming method of the embodiment will be described. FIG. 3 is a plan view showing a schematic construction of a portion including one TFT of a TFT array substrate. FIG. 4A is a section of a TFT, and FIG. 4B is a section of a portion where the gate wiring and the source wiring intersect in planar terms.

As shown in FIG. 3, on a TFT array substrate 10 having a TFT 30, there are provided a gate wiring 12, a source wiring 16, a drain electrode 14, and a pixel electrode 19 which is electrically connected to the drain electrode 14. The gate wiring 12 is formed so as to extend in the x-axis direction, part of which is formed so as to extend in the y-axis direction. And part of the gate wiring 12 extending in the y-axis direction is used as a gate electrode 11.

It should be noted that a width of the gate electrode 11 is narrower than a width of the gate wiring 12. And this gate wiring 12 is formed according to the wiring pattern forming method of the embodiment. Further, part of the gate wiring 16 formed so as to extend in the y-axis direction is formed in a broader width, part of this source wiring 16 being used as a source electrode 17.

As shown in FIG. 4, the gate wiring 12 is formed between the banks B on the substrate P. The gate wiring 12 and the bank B are covered with an insulation film 28, and on the insulation film 28 there are formed a source wiring 16, a source electrode 17, a drain electrode 14, and a bank B1. The gate wiring 12 is insulated by the insulation film 28 from the source wiring 16, while the gate electrode 11 is insulated by the insulation film 28 from the source electrode 17 and the drain electrode 14. The source wiring 16, the source electrode 17, and the drain electrode 14 are covered by the insulation film 29.

Figure 5:
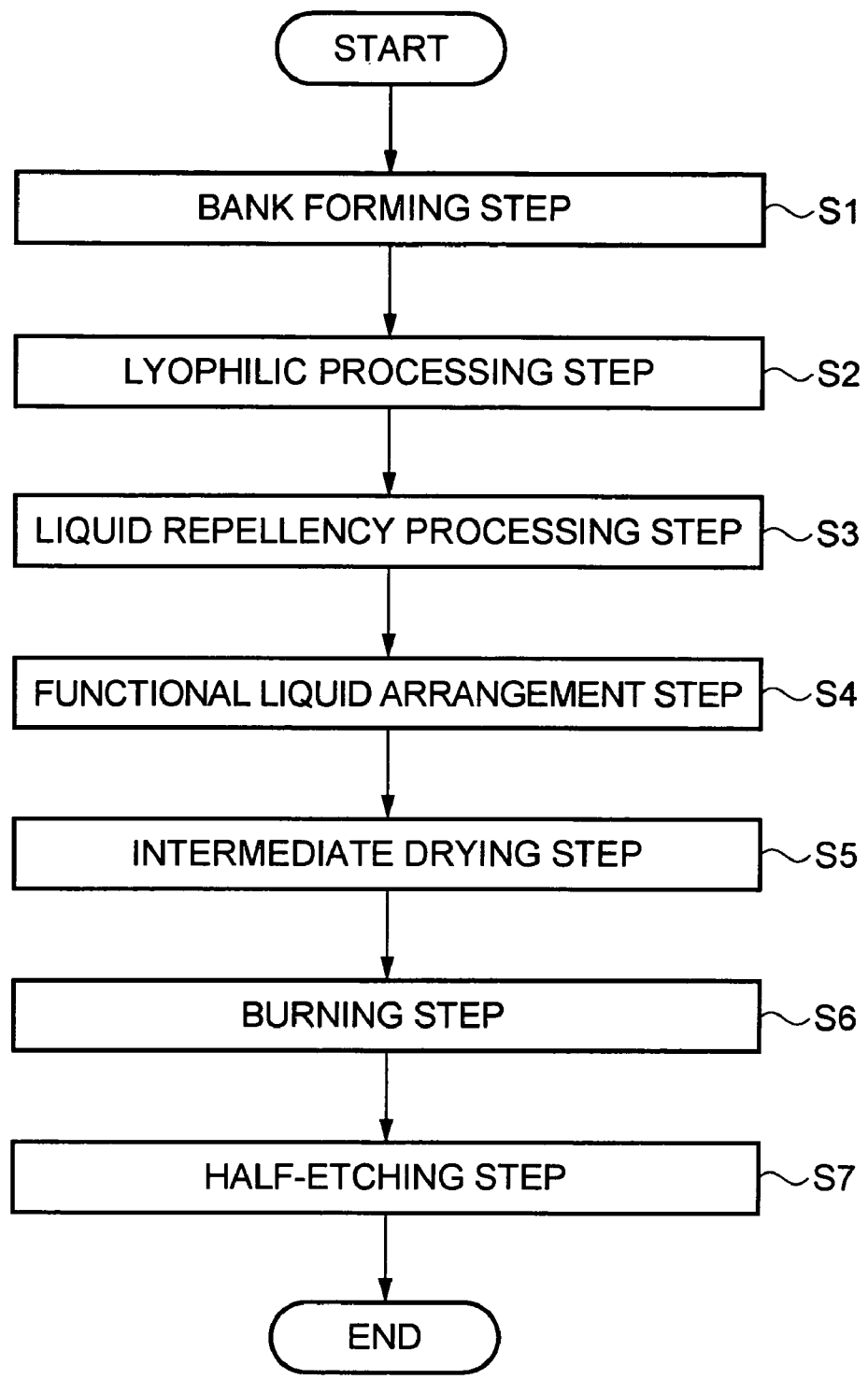
FIG. 5 is a flowchart showing a wiring pattern forming method of a first embodiment.

Next, the wiring pattern forming method of this embodiment will be described. FIG. 5 is a flowchart showing an example of the wiring pattern forming method according to this embodiment. The wiring pattern forming method according to the embodiment forms a wiring pattern by arranging the above-referenced ink for wiring pattern formation on the substrate, forming a wiring pattern, and forming a wiring film on the substrate.

Step S1 is a bank forming step of setting up a bank in protrusion on the substrate in a manner of forming a concavity according to the shape of a wiring pattern, while a next step, S2, is a lyophilic processing step to provide a lyophilic property to the substrate. A step S3 that follows is a liquid repellency processing step to provide liquid repellency to the bank.

Further, a next step S4 is a functional liquid arrangement step to arrange the ink between the banks B which are provided with liquid repellency. A succeeding step S5 is an intermediate drying step to remove at least part of a liquid component of the ink. A next step S6 is a burning step to carry out heat treatment to obtain conductivity if minute conductive particles contained in the ink are a silver compound. Further, a next step S7 is a half-etching step to subject the bank to half-etching.

Each step per processing step will now be explained in detail. In the embodiment, a glass substrate is employed as the substrate P. First, the bank forming step of step S1 will be described. FIG. 6 is a schematic diagram showing an example of a bank forming procedure. In the bank forming step, prior to coating a bank forming material, HMDS treatment is carried out on the substrate P as a surface quality reforming process.

Figure 6A:
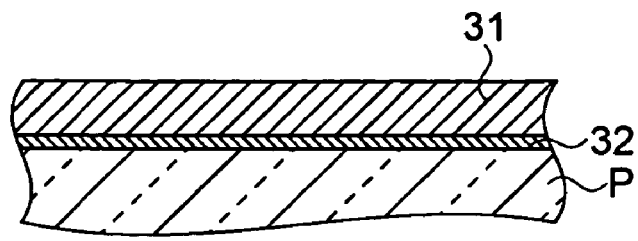
FIG. 6 is a schematic diagram showing an example of a procedure of forming a bank.

The HMDS treatment is a method of vaporizing hexamethyldisilazane (($CH_3$)$_3$SiNhSi($CH_3$)$_3$) and coating it. As shown in FIG. 6A, this forms an HMDS layer 32 on the substrate P as an adhered layer to improve adhesion between the bank B and the substrate P.

The bank B is a member to function as a a partition member. Formation of the bank B can be carried out by any method such as photolithography and printing. For example, when using photolithography, through a preset method such as spin coat, spray coat, roll coat, dye coat, and dip coat, a forming material 31 of a bank is coated on the HMDS layer 32 of the substrate P in keeping with the height of the bank, and a photoresist layer is coated thereon. And a mask is applied according to the shape of the bank (wiring pattern shape), and by exposing and developing a photoresist, a photoresist that fits the shape of the bank remains. In the final step, etching is applied and the bank material in parts other than the mask is removed.

Figure 6B:
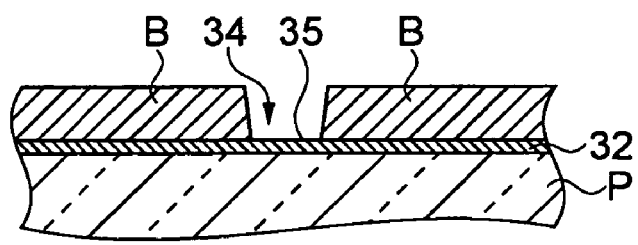

Through this method, as shown in FIG. 6B, the banks B are set up protrudingly in a manner of surrounding an area scheduled for the formation of a wiring pattern. It should be noted that, as the banks B to be formed in this manner, a width of its upper side is narrow while a width of its bottom side is broad in a tapered shape, so that such shape is desirable to make it easy for the ink droplets to flow into a groove between the banks as explained later.

In the wiring pattern forming method of the embodiment, as the forming material of the bank B, inorganic materials are used. For a method of forming the bank through the inorganic material, there is, for example, a method in which a layer made up of the inorganic material is formed on the substrate P by using various coat processes, CVD (chemical vapor deposition) and the like, followed by patterning through etching, ashing and the like, and obtaining a preset shape of the bank B. Note that the bank B may also be formed on an object other than the substrate P, such object then being arranged on the substrate P.

As the bank material, a material showing liquid repellency to ink is acceptable. As explained later, an insulating organic material capable of being made liquid repellent (fluorination), which has good adhesion to the base substrate and is easy to be patterned through photolithography, is also acceptable.

As the inorganic bank material, there may be cited, for example, a spin-on-glass film including any of silica glass, alkylsiloxane polymer, alkylsilo polymer, alkyl? hydride polymer, polyaryleether, a diamond film, fluorinated amorphous carbon film, and the like. Further, as inorganic bank materials, for example, aerogel, multi-pore silica and the like may be used. More specifically, as the inorganic material, photosensitive polymethylsilazane made by Clariant Japan Co., Ltd. may also be cited.

It should be noted that, as the forming material of the bank B, an organic material may also be used. As the organic material forming the bank, a material showing liquid repellency to ink may be acceptable. As explained later, an insulating organic material capable of being made liquid repellent (fluorination), which has good adhesion to the base substrate and is easy to be patterned through photolithography, is also acceptable. For example, it is possible to use a high molecule material such as an acrylic resin, a polyimide resin, an olefin resin, a phenol resin, and a melamine resin. Or a material having an organic radical with an inorganic skeleton (siloxane linkage) in its principal chain is acceptable.

Figure 6C:
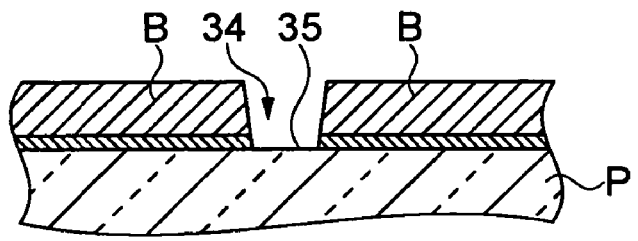

When the banks B are formed on the substrate P, hydrofluoric acid processing is carried out. Hydrofluoric acid processing stands for, for example, performing etching in an aqueous solution of 2.5% hydrofluoric acid. It is processing to remove the HMDS layer 32 between the banks B. In hydrofluoric acid processing, the banks B function as a mask, and as shown in FIG. 6C, the HMDS layer 32 which is an organic matter on a bottom 35 of the groove 34 formed between the banks B is removed and the substrate P is exposed.

Next, the lyophilic processing step of the step S2 will be described. In the lyophilic processing step of the step S2, the lyophilic processing to provide a lyophilic property to the bottom 35 (exposed part of the substrate P) between the banks B is carried out. For the lyophilic processing step, UV irradiation processing to irradiate UV rays as well as $O_2$ plasma processing using oxygen in the atmosphere as processing gas and the like can be selected. In the embodiment, the $O_2$ plasma processing is carried out.

In the $O_2$ plasma processing, oxygen in a plasma state is irradiated to the substrate P from a plasma discharge electrode. As an example of conditions of the $O_2$ plasma processing, for example, there are a plasma power of 50 to 1000W, an oxygen gas flow rate of 50 to 100 mL/min, a relative speed of the substrate P of 0.5 to 10 mm/sec with respect to the plasma discharge electrode of 0.5 to 10 mm/sec, and a substrate temperature of 70 to 90° C.

And if the substrate P is a glass substrate, its surface is lyophilic with respect to the ink for forming a wiring pattern. However, by carrying out the $O_2$ plasma processing and the UV irradiation processing as in the embodiment, the lyophilic property of the surface of the substrate P (bottom 35) which is exposed between the banks B can be further enhanced. At this point, it is desirable for the $O_2$ plasma processing and the UV irradiation processing to be carried out so that an angle of contact of the bottom 35 between the banks with respect to the ink may be less than 15 degrees.

Figure 7:
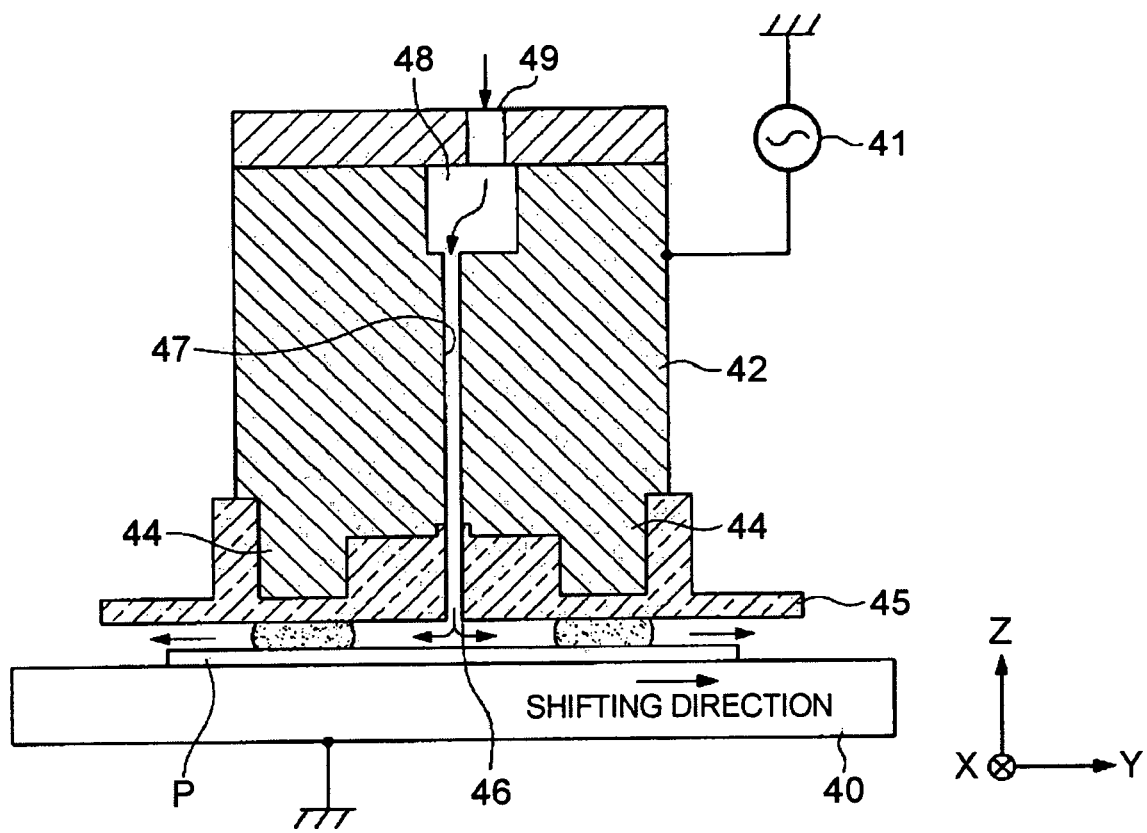
FIG. 7 is a schematic construction diagram of a plasma processing system.

FIG. 7 is a schematic construction diagram showing an example of a plasma processing device used when carrying out the $O_2$ plasma processing. The plasma processing device shown in FIG. 7 has an electrode 42 connected to an AC power source 41 and a sample table 40 which is an earth electrode.

The sample table 40 is movable in the y-axis direction while supporting the substrate P which is a sample. At the lower surface of the electrode 42, there are protrudingly installed two parallel discharge generating sections 44 and 44 extending in the x-axis direction intersecting perpendicularly the moving direction, while, at the same time, a dielectric member 45 is set up in a manner of surrounding the discharge generating sections 44.

The dielectric member 45 prevents abnormal discharge from the discharge generating sections 44. And the lower surface of the electrode 42 including the dielectric member 45 is in an approximately planar shape, so that a little space (discharge gap) is formed between the discharge generating sections 44, the dielectric member 45, and the substrate P.

Further, in the center of the electrode 42, there is provided a gas jet 46 which constitutes part of the process gas supply section formed in a long and narrow way in the x-axis direction. The gas jet 46 is coupled to a gas introduction port 49 through a gas passage 47 and an intermediate chamber 48 inside the electrode.

A preset gas including a process gas which passes the gas passage 47 to be jetted out from the gas jet 46 is divided inside the above-referenced space into front and rear of the moving direction (y-axis direction) and flows to be exhausted to the outside from the front end and the rear end. At the same time, a preset voltage is impressed on the electrode 42 from the AC power source 41, generating a vapor discharge between the discharge generating sections 44 and 44 and the sample table 40. And plasma generated by this vapor discharge generates an excitation active seed of the preset gas, causing the entire surface of the substrate P passing through the discharge area to be consecutively processed.

In the embodiment, the preset gas is a mixture of oxygen ($O_2$), which is a process gas, a rare gas such as helium (He) and argon (Ar) for starting discharge easily and maintaining it stably under pressure in the vicinity of the atmospheric pressure, and an inert gas such as nitrogen ($N_2$).

Especially, by using oxygen as the process gas, the residue of organic matter (the photoresist and the HMDS) at the time of bank formation on the bottom 35 between the banks B may be removed. Namely, there is a case where the above-referenced hydrofluoric processing is unable to eliminate completely the HMDS (organic matter) of the bottom 35 between the banks B.

Or, there may be a case where the photoresist (organic matter) at the time of bank formation on the bottom 35 between the banks B is remaining. Now, by performing the $O_2$ plasma processing, the residue on the bottom 35 between the banks B can be eliminated.

Although it was explained herein that hydrofluoric acid processing was carried out to eliminate the HMDS layer 32, because the HMDS layer 32 of the bottom 35 between the banks can be sufficiently eliminated through the $O_2$ plasma processing or UV irradiation processing, the hydrofluoric acid processing does not need to be carried out. Further, it was described herein that either the $O_2$ plasma processing or the UV irradiation processing be carried out for lyophilic processing. However, a combination of the $O_2$ plasma processing and the UV irradiation processing can naturally be used.

Next, the liquid repellency processing step of the step S3 will be described. In the liquid repellency processing step, the plasma processing method ($CF_4$ plasma processing method) using tetrafluoromethane as process gas is employed. The conditions of the $CF_4$ plasma processing are, for example, a plasma power of 50 to 1000 W, a tetrafluoromethane gas flow rate of 50 to 100 mL/min, a substrate transfer rate with respect to the plasma discharge electrode of 0.5 to 1020 mm/sec, and a substrate temperature of 70 to 90° C.

It should be noted that as the process gas, not only tetrafluoreomethane but also other gases of fluorocvarbon type or a gas such as SF6 and SF5CF3 may be used. For the $CF_4$ plasma processing, a plasma processing device explained with reference to FIG. 7 may be used.

By carrying out such liquid repellency processing, a fluorine radical is introduced into a resin making up the banks B to provide high liquid repellency to the banks B. Note that the $O_2$ plasma processing as lyophilic processing may be carried out prior to formation of the bank B, while, resulting from a property that pre-processing by $O_2$ plasma makes it easier to bring about fluorination (liquid repellency), the $O_2$ plasma processing after formation of the bank B is preferable.

It should be noted that through the liquid repellency processing of the banks B, there may be some effect upon the exposed portion of the substrate P between the banks which were subjected to lyophilic processing beforehand. Nevertheless, especially if the substrate P is made up of glass and the like, as described above, introduction of the fluorine radical resulting from liquid repellency processing does not occur, hence, the substrate P is such that its lyophilic property, that is, wettability, does not virtually deteriorate.

Through the lyophilic processing step and the liquid repellency processing step, surface quality reforming processing has been carried out such as to raise the liquid repellency of the bank B higher than the liquid repellency of the bottom 35 between the banks.

It should be noted that the $O_2$ plasma processing is carried out herein as the lyophilic processing. But, as described above, if the substrate P is made up of glass and the like, introduction of the fluorine radical resulting from liquid repellency processing does not occur, hence, the liquid repellency of the bank B can be made higher than the bottom 35 between the banks even by carrying out only $CF_4$ plasma processing without performing the $O_2$ plasma processing.

Next, the functional liquid arrangement step of the step S4 will be described. FIG. 8 is a schematic diagram showing a procedure to arrange the functional liquid and an example of a procedure to form a wiring film. In the functional liquid arrangement step, the liquid droplet of the ink for forming a wiring pattern is arranged between the banks B on the substrate P by using the liquid droplet ejection method through the liquid droplet ejection device IJ.

Figure 8A:
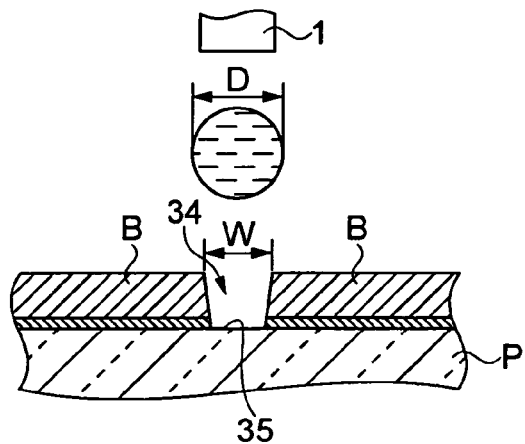
FIG. 8 is a schematic diagram showing a procedure of arranging a functional liquid and a procedure of forming a wiring film by drying the functional liquid.

It should be noted that ink composed of an organic silver compound is used herein as a conductive material, ejecting an ink made up of an organic silver compound using diethyleneglycoldiethylether as a solvent (disperse medium). In the functional liquid arrangement step, as shown in FIG. 8A, the ink containing the wiring pattern forming material is made into the liquid droplet and ejected from the liquid droplet ejection head 1.

The liquid droplet ejection head 1 ejects the liquid droplet of the ink onto the groove 34 between the banks B and arranges the ink inside the groove 34. At this time, since the preset area of the wiring pattern formation (that is, the groove 34) to which the liquid droplet is ejected is surrounded by the banks B, the liquid droplet is prevented from spreading to other than the preset position.

In the embodiment, a width WE of the groove 34 between the banks B (a width at the opening of the groove 34 herein) is approximately equal to a diameter D of a liquid droplet of the ink (functional liquid). Note that it is preferable for an atmosphere under which to eject the liquid droplet to be set at a temperature under 60° C. and a humidity under 80%. This enables the ejection nozzle of the liquid droplet ejection head 1 to eject the droplet stably without clogging.

Figure 8B:
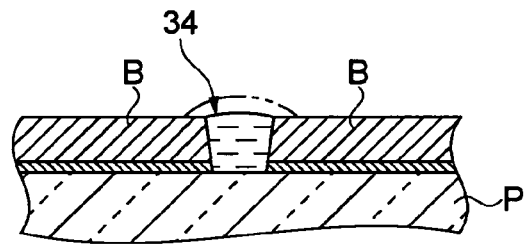

When such liquid droplet is ejected from the liquid droplet ejection head 1 and arranged in the groove 34, since the liquid droplet's diameter D is approximately equal to the width W of the groove 34, as shown in double dot chain lines in FIG. 8B, part of it may be on the banks B at times. On the other hand, since the surface of the banks B is liquid repellent and tapered, these liquid droplet portions on the banks B are repelled from the banks B. Further, as such portions drip into the groove 34 resulting from a capillary phenomenon, as shown in solid lines in FIG. 8B, most of the liquid droplet enters the groove 34.

Further, the ink ejected into the groove 34 or dripped from the banks B, because the substrate P (bottom 35) is subjected to the lyophilic processing, becomes wet and tends to spread. This makes the ink to be embedded in the groove 34 more uniformly.

Next, the intermediate drying step of the step S5 will be described. After the liquid droplet is ejected onto the substrate P, to remove the disperse medium and secure film thickness, drying processing is carried out as necessary. The drying processing can be done, for example, through processing such as a normal hot plate and an electric furnace to heat the substrate P, also by lamp anneal. As a light source of light used for lamp anneal, nothing is particularly specified. An infrared lamp, a xenon lamp, a YAG laer, an argon laser, a carbonic acid gas laser, an excimer laser such as XeF, XeCl, XeBr, KrF, KrCl, ArF, and ArCl may be used as the light source.

Figure 8C:
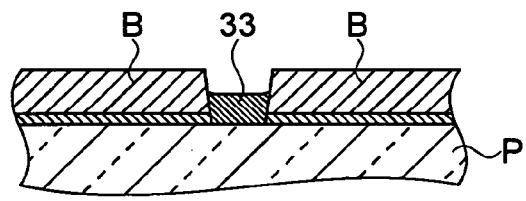

These light sources ranging in output from more than 10W to under 5000W are generally used. In the embodiment, a range of more than 100W and under 1000W is sufficient. Upon completion of the intermediate drying step, as shown in FIG. 8C, a circuit wiring film 33 which is a wiring film to form a wiring pattern is formed. In the embodiment, the wiring patterns formed by the circuit wiring film 33 are the gate wiring 12 and the gate electrode 11.

If a thickness of the circuit wiring film 33 which can be formed by a one-time functional liquid arrangement step and the intermediate drying step does not attain a necessary film thickness, this intermediate drying step and the above-referenced functional liquid arrangement step are repeatedly carried out.

Figure 8D:
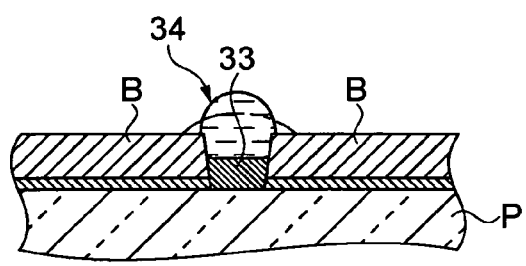
Figure 8E:
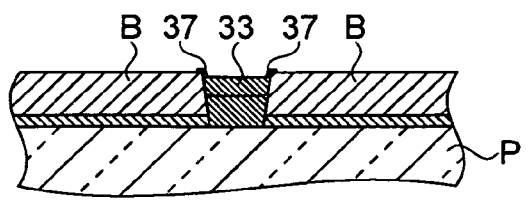

When the functional liquid is arranged upon the formed circuit wiring film 33, as shown in FIG. 8D, the functional liquid which cannot fully enter the groove 34 bulges out onto the groove 34 such that part of it is in the state of being on the bank B. And by carrying out the intermediate drying step again, as shown in FIG. E, the ink liquid droplet is layered over to form the circuit wiring film 33 of a heavy thickness.

However, the functional liquid in the state, in which part of it is on the bank B, becomes a bulge 37 as it is dried while in the state of being on the bank B. The bulge 37 extends to the circuit wiring film 33, so that the bulge 37 which is part of the circuit wiring film 33 is in the state of bulging out onto the bank B.

It should be noted that by selecting properly the thickness of the circuit wiring film 33 formed in the one-time functional liquid arrangement step and the intermediate drying step and the number of times of repeating the intermediate drying step and the above-referenced functional liquid arrangement step in terms of the necessary film thickness, it is possible to obtain the necessary film thickness.

Next, the burning step of the step S6 will be described. If the dried film after the intermediate drying step is an organic silver compound, it is necessary for it to be heated to obtain conductivity, to remove any organic portion of the organic silver compound, so that silver particles remain. Accordingly, the substrate after the ejection step is subjected to heat treatment and/or optical processing.

While heat treatment and/or optical processing is normally conducted in the atmosphere, as necessary, it can be carried out in an inert gas atmosphere such as nitrogen, argon, and helium or in a reduction atmosphere such as hydrogen. Treating temperature of heat treatment and/or optical processing is properly determined by considering a boiling point (steam pressure) of the disperse medium, type and pressure of the atmosphere gas, thermal behavior such as dispersibility and oxidizability of minute particles, presence and quantity of a coating material, heat-resisting temperature of the substrate, and the like.

In the embodiment, with respect to the ink which formed an ejected pattern, a burning step is carried out in a clean oven at a temperature from 280 to 300° C. for 30 minutes under the atmosphere. It should be noted that, for example, for eliminating the organic portion of the organic silver compound, burning must be conducted at about 200° C.

Further, in case of using a substrate such as plastics, it is preferable to carry out this step at temperatures more than room temperature and less than 250° C. Resulting from the steps described above, the dried film following the ejection step is assured of electrical contact among minute particles, thereby being converted to a conductive film.

Figure 9A:
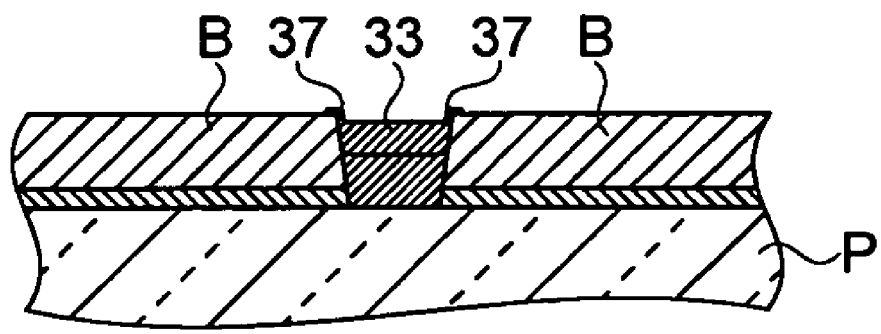
FIG. 9 is a schematic diagram showing a state in which the bank is subjected to half-etching.

Next, the half-etching step of the step S7 will be described. FIG. 9 is a schematic diagram showing the bank in the state of being half-etched. FIG. 9A shows a state in which the circuit wiring film 33 is formed after each step up to the step S6 is completed. There is a step portion between the upper surface of the bank B and the upper surface of the circuit wiring film 33 in such a way that the bulge 37 linked to the circuit wiring film 33 is in the state of bulging out onto the bank B.

Figure 19A:
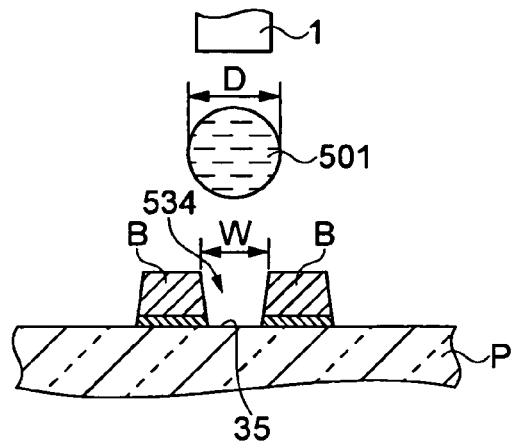
FIG. 19 is a schematic diagram showing a procedure of arranging a currently available functional liquid and a procedure of drying the functional liquid and forming a wiring film.
Figure 19B:
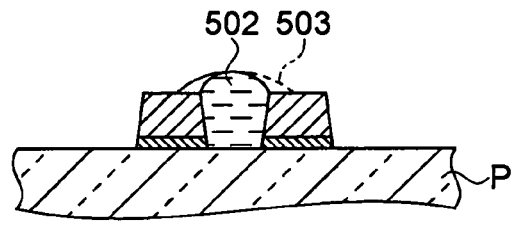
Figure 19C:
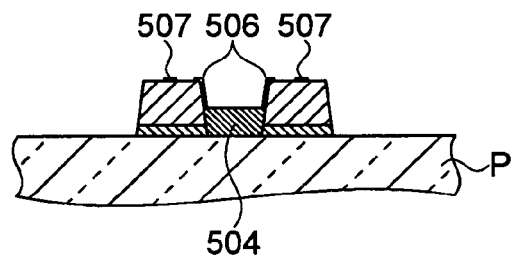
Figure 19D:
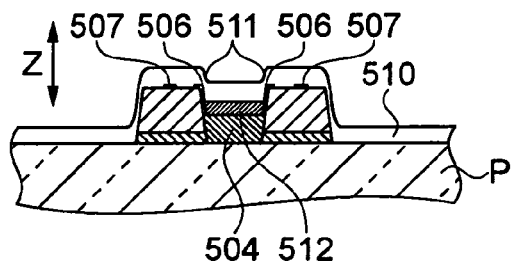
Figure 19E:
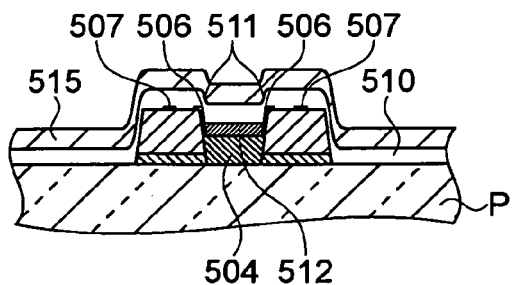

When an insulation film is formed on the bank B and the circuit wiring film 33, the insulation film becomes thin at the step portion. Since there is a good possibility of insufficient insulating function at the thin portion, if other wiring film and a conductive layer of a semiconductor device are formed on the insulation film, as shown in FIG. 19E, there is an increased possibility of a defect such as a short-circuit to generate between the circuit wiring film 33 and the wiring film formed on the insulation film and the conductive layer of the semiconductor device.

Further, the bulge 37 linked to the circuit wiring film 33 is in the state of bulging out from the circuit wiring film 33 onto the bank B, being positioned on the step portion between the upper surface of the bank B and the upper surface of the circuit wiring film 33. Namely, the bulge 37 is in contact with the thin portion of the insulation film, so that there is a higher possibility of a defect such as a short-circuit with the wiring film formed on the insulation film and the conductive layer of the semiconductor device.

Half-etching is carried out by using an alkaline aqueous solution which selectively etches only the bank B. As the alkaline aqueous solution which selectively etches only the bank B, there may be cited tetraalkylammoniumhydroxide, trialkylammoniumhydroxide, tetramethylammnoniumhydroxide, N,N-diaklyethanolamine, potassium hydroxide, sodium hydroxide and the like.

Figure 9B:
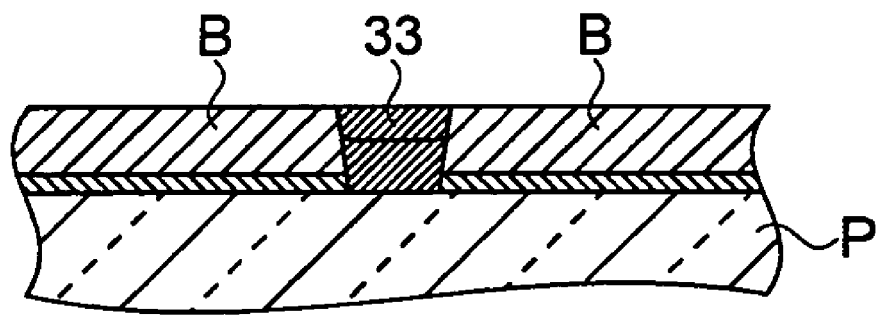

By subjecting the bank to half-etching, the circuit wiring film 33 of a section shown in FIG. 9B can be obtained. The upper surface of the bank B and the upper surface of the circuit wiring film 33 are approximately on the same plane, and the bulge 37 is removed together with the upper surface of the bank B which is etched and removed.

According to the embodiment, the following advantageous effect is obtained.

1. In the wiring pattern forming method of the embodiment, as the forming material of the bank B, an inorganic material is used. Since an inorganic resin is heat-resistant, a bank excelling in heat resistance can be formed. Further, a difference of a thermal expansion rate between the bank B and the substrate P formed of glass becomes small.

Resulting from the bank B's excellent heat resistance and the small difference of the thermal expansion rate between the bank B and the substrate P. in the intermediate drying step and the burning step for forming the circuit wiring film 33 on the groove 34 between the banks B, it is possible to carry out processing necessary for the bank to be exposed to the high-temperature environment without affecting the bank.

Further, in the step of forming a thin film on the bank B, it is possible to carry out processing necessary for the bank to be exposed to a high-temperature environment without affecting the bank.

2. By half-etching the bank B, the thickness of the bank B is made approximately the same as the thickness of the circuit wiring film 33. As a result, it is possible to restrain the step between the bank B and the circuit wiring film 33 from becoming larger. This makes it possible to restrain the insulation film 28 to be formed on the bank B and the circuit wiring film 33 (gate wiring 12) from getting thin at the step portion. Hence, it is possible to restrain the circuit wiring film 33 from generating a short-circuit and the like resulting from the thinning of the insulation film 28, when the circuit wiring film 33 comes in contact with the source wiring 16 and other thin film layers, which are separated by the insulation film 28.

3. By half-etching the bank B, the thickness of the bank B is made approximately the same as the thickness of the circuit wiring film 33. At this time, a wiring material bulging out onto the bank can be removed. Namely, since the bank B and the wiring material positioned at a border of the bank B and the circuit wiring film 33, which has a relatively high possibility that the insulation film 28 to be formed on the bank B and the circuit wiring film 33 (gate wiring 12) becomes thin, are removed, it is possible to further restrain the circuit wiring film 33 from generating a short-circuit and the like resulting from the thinning of the insulation film 28, when the circuit wiring film 33 comes in contact with the source wiring 16 and other thin film layers, which are separated by the insulation film 28.

4. Since it is possible to restrain the circuit wiring film 33 from generating a short-circuit and the like resulting from the thinning of the insulation film 28, as the circuit wiring film 33 comes in contact with the source wiring 16 and other thin film layers, which are separated by the insulation film 28, there is little possibility that a defect such as a short-circuit occurs, hence, a TFT 30 of high reliability can be realized.

Second Embodiment

Next, a second embodiment of the wiring pattern forming method according to the invention will be described. A liquid droplet ejection method and a liquid droplet ejection device to be used in the embodiment and a semiconductor device to be manufactured are basically the same as the liquid droplet ejection method and the liquid droplet ejection device, and the semiconductor device in the first embodiment. The wiring pattern forming method different from the first embodiment will be described.

Figure 10:
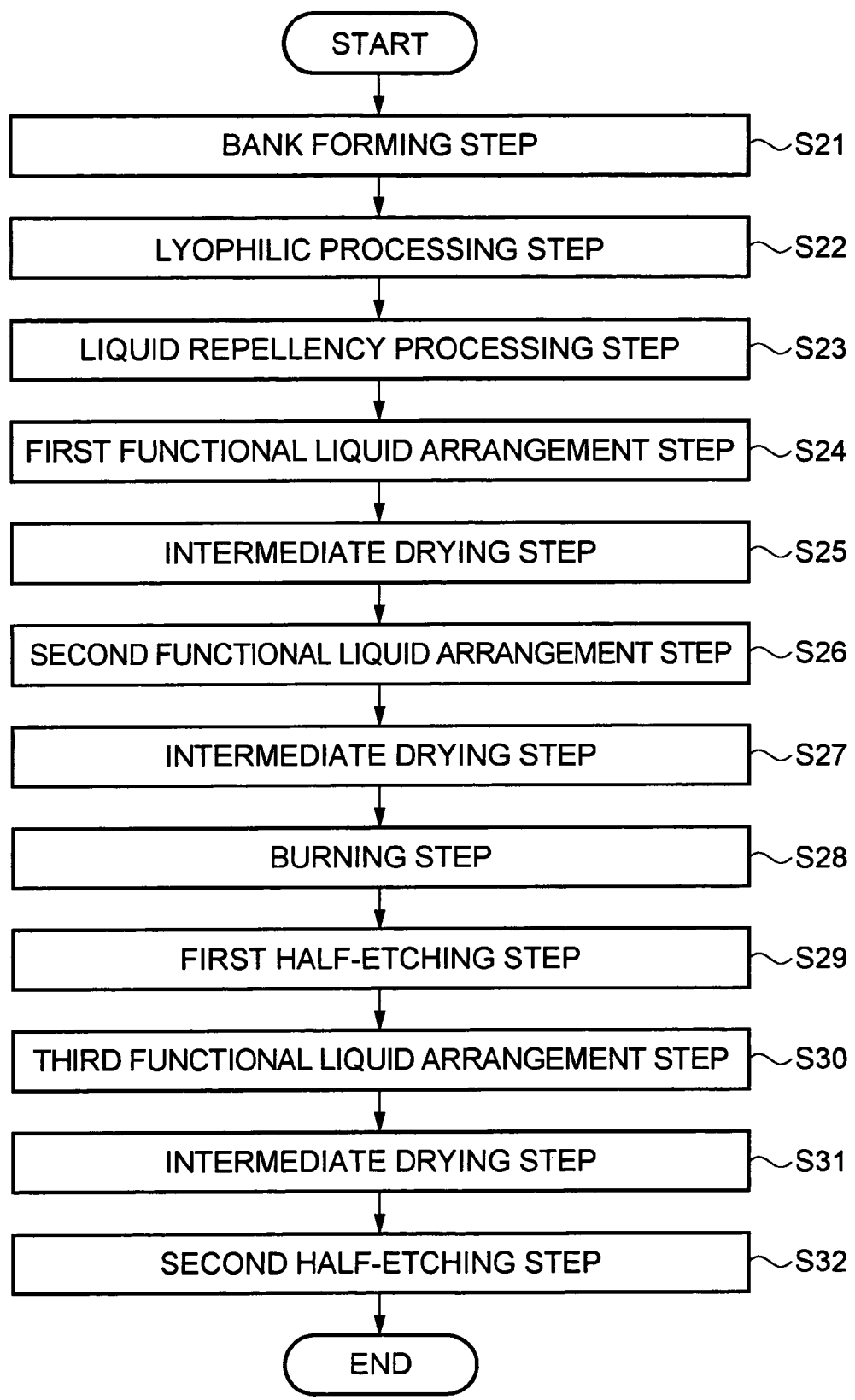
FIG. 10 is a flowchart showing a wiring pattern forming method of a second embodiment.

FIG. 10 is a flowchart showing an example of the wiring pattern forming method according to the embodiment. In the wiring pattern forming method according to the embodiment, the above-referenced ink for forming a wiring pattern is arranged on the substrate and a conductive film wiring pattern is formed on the substrate. A step S21 is a bank forming step to set up the bank B protrudingly so as to form a concavity according to the shape of a wiring pattern on the substrate, a next step 22 is a lyophilic processing step to provide the lyophilic property to the substrate, and a next step S23 is a liquid repellency processing step to provide liquid repellency to the bank B.

A next step S24 is a first functional liquid arrangement step to arrange the ink for forming a lyophilic thin film on a concavity between the banks B, a succeeding step S25 is an intermediate drying step to remove at least part of the liquid component of the ink, and a next step S26 is a second functional liquid arrangement step to arrange ink for forming a conductive thin film (wiring film) on the concavity between the banks B. A next step S27 is an intermediate drying step to remove at least part of a liquid component of the ink, and a next step S28 is a burning step to carry out heat treatment to obtain conductivity if minute conductive particles contained in the ink is an organic silver compound.

Further, a subsequent step S29 is a first half-etching step to subject the bank and the conductive film to half-etching. A next step S30 is a third functional liquid arrangement step to arrange ink for forming a diffusion preventing film on the wiring film, and a next step S31 is an intermediate drying step to remove at least part of the liquid component of the ink. Furthermore, a succeeding step S32 is a second half-etching step to half-etch the bank.

Each step per processing step will now be explained in detail. In the embodiment, a glass substrate is employed as the substrate P. The bank forming step of step S21 is basically the same as the bank forming step of the step S1 in the first embodiment. Through the bank forming step of the step S21, a bank shown in FIG. 6C is formed.

The lyophilic processing step of the step S22 is basically the same as the lyophilic processing step of the step S2 in the first embodiment. Through the lyophilic processing step of the step S22, the lyophilic property is provided to the bottom 35 (export portion of the substrate P) between the banks B.

A next step S23 of the liquid repellency processing step is basically the same as the liquid repellency processing step of the step S3. Through the step S23 of the liquid repellency processing step, liquid repellency is provided to the surface of the bank.

Figure 11A:
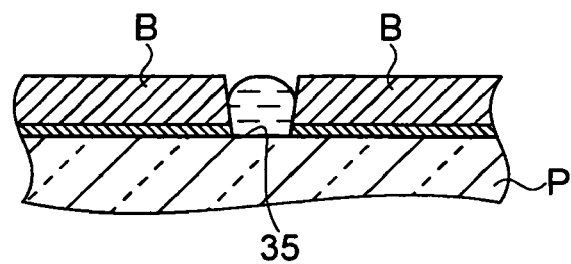
FIG. 11 is a schematic diagram showing a procedure of arranging the functional liquid and a procedure of drying the functional liquid and forming a wiring film.

Next, in a step S24 of the first functional liquid arrangement step, by using the liquid droplet ejection method through the above-referenced liquid droplet ejection device IJ, the liquid droplet of ink for forming a lyophilic film 71 is arranged between the banks B on the substrate P as shown in FIG. 11A. The lyophilic film 71 is a thin film having the lyophilic property with respect to the ink for forming a wiring pattern to be next arranged on the concavity between the banks B. Note that the ink for forming the lyophilic film 71 uses manganese for its raw material to form the lyophilic film 71.

Figure 11B:
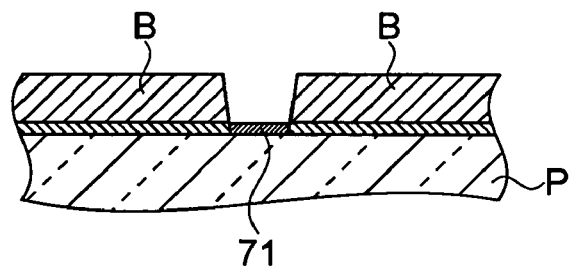

In a next step S25 of the intermediate drying step, after ejecting the liquid droplet onto the substrate P, drying processing is carried out as necessary to remove the disperse medium and secure film thickness. The next step S25 of the intermediate drying step is basically the same as the step S5 of the intermediate drying step in the first embodiment. Through the next step S25 of the intermediate drying step, as shown in FIG. 11B, the lyphilic film 71 is a thin film having the lyophilic property with respect to the ink for forming a wiring pattern to be next arranged on the concavity between the banks B.

Figure 11C:
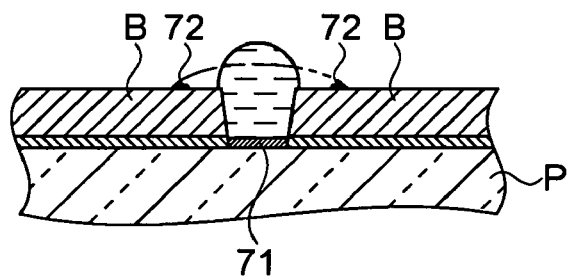

In a step S26 of the second functional liquid arrangement step, by using the liquid droplet ejection method through the above-referenced liquid droplet ejection device IJ, the liquid droplet of ink for forming a wiring pattern is arranged between the banks B on the substrate P as shown in FIG. 11C. Note that an organic silver compound is used herein as a conductive material, while ejecting ink made up of an organic silver compound using diethyleneglycoldiethylether as its solvent (disperse medium).

In the second functional liquid arrangement step, as shown in FIG. 8A, ink containing the material for forming a wiring pattern is made from the liquid droplet ejection head 1 to the liquid droplet and ejected. The liquid droplet ejection head 1 arranges the ink inside the groove 34 by directing at the groove 34 between the banks B and ejecting the ink liquid droplet. At this time, since the preset area for forming a wiring pattern (that is, the groove 34) to which the liquid droplet is ejected is surrounded by the banks B, the liquid droplet is prevented from spreading from outside the preset position.

The width W of the groove 34 between the banks B (width of the opening of the groove 34 herein) is set up approximately the same as the diameter D of the liquid droplet of the ink (functional liquid). When such liquid droplet is ejected from the liquid droplet ejection head 1 and arranged inside the groove 34, since the liquid droplet has its diameter D approximately the same as the width W of the groove 34, as shown by the double dot chain lines in FIG. 11C, part of it may sit on the banks B at times.

On the other hand, the banks B have a liquid repellent surface and are tapered, so that as the liquid droplet portions sitting on the banks B are repulsed from the banks B and further flow down into the groove 34 resulting from the capillary phenomenon, nearly all the liquid droplet enters the groove 34 as shown in solid lines in FIG. 11C. But, a minute piece of the liquid droplet becomes a residue 72 and may remain on the bank B.

On the other hand, ink ejected into the groove 34 or dripped down from the banks B fills in the groove 34 uniformly, because the lyophilic film 72 having the lyophlic property to the ink for forming a wiring pattern is formed on the concavity between the banks B to facilitate getting wet and spreading.

In a next step S27 of the intermediate drying step, after the liquid droplet of the ink for forming a wiring pattern is ejected to the concavity between the banks B, to remove the disperse medium and secure film thickness, drying processing is carried out as necessary. The intermediate drying step of the step S27 is basically the same as the intermediate drying step of the step S5 in the first embodiment.

Figure 11D:
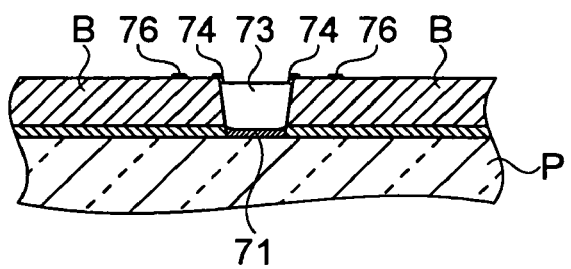

Through the intermediate drying step of the step S25, as shown in FIG. 11D, there is formed a circuit wiring film 73 which is a wiring film to form a wiring pattern in the concavity between the banks B. In the embodiment, the wiring pattern formed by the circuit wiring film 73 and a diffusion preventing film 77 to be explained later consists of the gate wiring 12 and the gate electrode 11 described by showing in FIGS. 3 and 4 in the first embodiment.

If a thickness of the circuit wiring film 73 which can be formed by the one-time functional liquid arrangement step and the intermediate drying step does not attain a necessary film thickness, this intermediate drying step and the above-referenced functional liquid arrangement step are carried out repeatedly.

When a functional liquid which can produce the circuit wiring film 73 of sufficient thickness is arranged, as shown in FIG. 11C, a functional liquid which cannot completely fill in the groove 34 bulges out onto the groove 34, so that part of it is in the state of being on the bank B. And by carrying out the intermediate drying step again, as shown in FIG. 11D, the ink droplet is layered over to form the circuit wiring film (thin film pattern) 73 of a heavy film thickness.

However, the functional liquid part of which is in the state of being on the bank B dries up while being in the state of being on the bank B, a bulge 74 is formed. The bulge 74 is linked to the circuit wiring film 73, so that the bulge 74 which is part of the circuit wiring film 73 finds itself in the state of bulging out onto the bank B.

Further, since a remaining liquid 72 left on the bank B dries up, a residue 76 of the conductive material is formed on the bank B. It should be noted that by properly selecting a number of times of repeating the intermediate drying step and the above-referenced functional liquid from a thickness of the circuit wiring film 73 which can be formed by the one-time functional liquid arrangement step and the intermediate drying step as well as the necessary film thickness, it is possible to obtain a necessary film thickness.

In a next step S28 of the burning step, heat treatment is carried out to obtain conductivity. In case of an organic silver compound, a dried film after the intermediate drying step must be subjected to heat treatment to obtain conductivity, remove an organic portion of the organic silver compound and let silver particles to remain.

For that purpose, the substrate after the ejection step is subjected to heat treatment and/or optical processing. The step S28 of the burning step is basically the same as the burning step of the step S6 in the first embodiment. Through the burning step of the step S28, electrical contact among minute particles is secured in regard to the dried film which is converted to a conductive film.

Figure 12A:
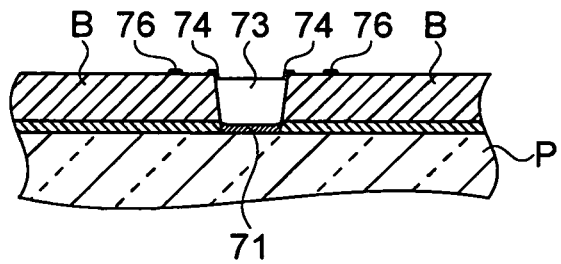
FIG. 12 is a schematic diagram showing a procedure of subjecting the bank to half-etching and a procedure of forming a diffusion preventing film.

In a next step S29 of a first half-etching step, the bank B and the circuit wiring film 73 are subjected to half-etching in sequence. FIG. 12A shows a state in which each step up to the step S28 is completed with formation of the circuit wiring film 73. There is a step between the upper surface of the bank B and the upper surface of the circuit wiring film 73, while the bulge 74 which is linked to the circuit wiring film 73 and in continuity is in the state of bulging out onto the bank B. Further, it is apart from the circuit wiring film 73, and although not in continuity, the residue 76 of the conductive material is formed on the bank B.

If an insulation film is formed on the bank B and the circuit wiring film 73, as shown in FIG. 19E, the insulation film tends to be thin at the step portion. Since there is a high possibility that an insulating fuction is not sufficient at a portion which has become thin, once other wiring films and the conductive layer of the semiconductor device are formed on the insulation film, there is a high possibility of generating, at the portion which has become thin, a defect such as a short-circuit between the circuit wiring film 73 and the wiring film formed on the insulation film and the conductive layer of the semiconductor device.

Further, the bulge 74 linked to the circuit wiring film 73 is in the state of bulging out from the circuit wiring film 73 to over the bank B, and is positioned at the step portion between the upper surface of the bank B and the upper surface of the circuit wiring film 73. Namely, the bulge 74 is in contact with the portion where the insulation film is thin, so that there is a higher possibility of generating a defect such as a short-circuit with the wiring film formed on the insulation film and the conductive layer of the semiconductor device.

Still further, as explained later, to prevent the conductive material from diffusing to the insulation film formed on the bank B and the circuit wiring film 73, the diffusion preventing film 77 is formed on the circuit wiring film 73. But, the bulge 74 and the residue 76 of the conductive material formed on the bank B somewhat apart from the diffusion preventing film 77 cannot be covered with the diffusion preventing film 77. Consequently, the bulge 74 and the residue 76 of the conductive material diffuse to the insulation film.

Half-etching of the bank B is carried out by using an alkaline aqueous solution which selectively performs etching of only the bank B. As the alkaline aqueous solution which performs etching of only the bank B, there may be cited an acueous solution such as tetraalkylammoniumhydroxide. trialkylammoniumhydroxide, tetraalkylammoniumhydroxide, N,N-dialkylethanolamine, potassium hydroxide, and sodium hydroxide.

Half-etching of the circuit wiring film 73 is carried out by using a solution which selectively performs etching of only the circuit wiring film 73. As a solution which performs etching of only the circuit wiring film 73, if the conductive material is silver, there may be cited an inorganic acid containing one kind or more than two kinds selected from a group consisting of phosphoric acid, sulfuric acid, and nitric acid; and oxidizing agents containing one kind or more than two kinds of ferric nitrate, ferric sulfate, hydrogen peroxide, ammonium cerium (II) nitrate, nitric acid, peroxodisulfuric acid, permanganate, manganate, chromic acid, nitrate, peroxodisulfate, permanganate, manganate, and chromate.

Figure 12B:
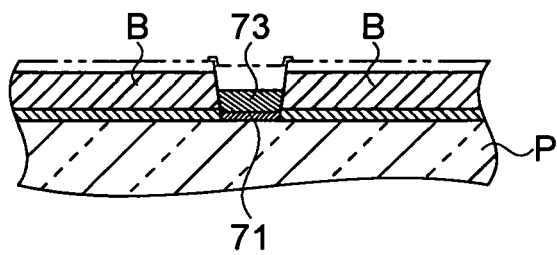
Figure 12C:
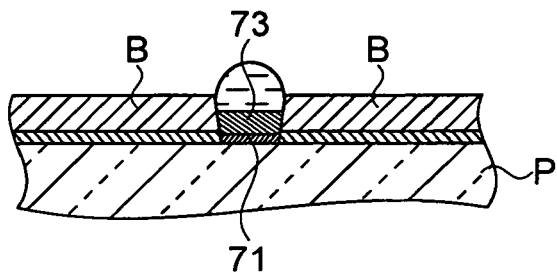
Figure 12D:
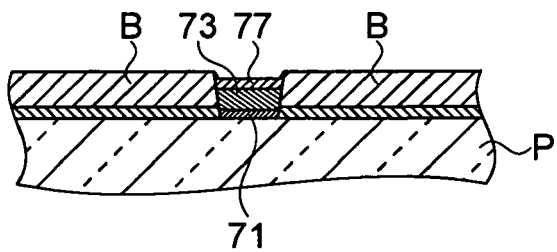

By subjecting the bank B and the circuit wiring film 73 to half-etching, the circuit wiring film 73 of a section shown in FIG. 12B may be obtained. There is a slight step between the upper surface of the bank B and the upper surface of the circuit wiring film 73, and the upper surface of the circuit wiring film 73 is concave with respect to the upper surface of the bank B.

The bulge 74 is removed together as the upper surface of the circuit wiring film 73 is etched and removed. The residue 76 is removed together as the upper surface of the bank B is etched and removed.

In a next step S30 of a third functional liquid arrangement step, there is arranged ink for forming the diffusion preventing film 77 on the wiring film. Note that the ink for forming the diffusion preventing film 77 uses nickel as the raw material forming the diffusion preventing film 77.

In a next step 31 of the intermediate drying step, after the liquid droplet of the ink for forming the diffusion preventing film is ejected onto the wiring film between the banks B, to remove the disperse medium and secure film thickness, drying processing is carried out as necessary. The next step 31 of the intermediate drying step is basically the same as the step S5 of the intermediate drying step in the first embodiment.

Through the step 25 of the intermediate drying step, the diffusion preventing film 77 is formed on the circuit wiring film 73 between the banks B. It should be noted that the diffusion preventing film 77 has nickel as its material, hence, the wiring film in the embodiment is constituted by the circuit wiring film 73 and the diffusion preventing film 77. And, as described above, in the embodiment, the wiring pattern formed of the circuit wiring film 73 and the diffusion preventing film 77 is the gate wiring 12 and the gate electrode 11 explained by showing in FIGS. 3 and 4 in the first embodiment.

In a next step S32 of a second half-etching step, the bank B is subjected to half-etching. The half-etching of the bank B is carried out, like the above-referenced half-etching step, by using an alkaline aqueous solution which only etches the bank B selectively.

Figure 12E:
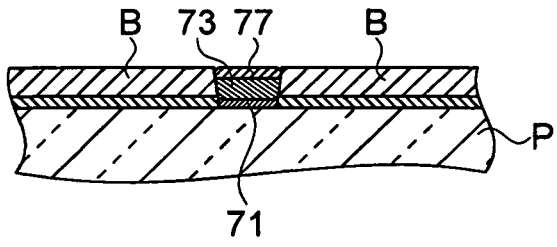

By subjecting the bank B to half-etching, the circuit wiring film 73 and the diffusion preventing film 77 of a section shown in FIG. 12E may be obtained. The upper surface of the bank B and the upper surface of the circuit wiring film 73 are approximately on the same plane.

According to the embodiment, the following advantageous effect is obtained.
1. In the first half-etching step, by subjecting the bank B to half-etching, it is possible to eliminate nearly all wiring material not covered by the diffusion preventing film 77 to be formed on the circuit wiring film 73 in the next step since the bulge 74 bulging out onto the bank B and the residue 76 of the wiring material remaining on the bank B are removed.

This makes it possible to restrain the wiring material from diffusing to the insulation film 28 which is formed in a manner of covering the bank B and the diffusion preventing film 77. Namely, it is possible to restrain performance deterioration of the TFT 30 resulting from the diffusion of the wiring material on the insulation film 28.
2. In the first half-etching step, by subjecting the circuit wiring film 73 to half-etching, it is possible to eliminate nearly all wiring material not covered by the diffusion preventing film 77 to be formed on the circuit wiring film 73 in the next step since the bulge 74 bulging out onto the bank B and the residue 76 of the wiring material remaining on the bank B are removed.

This makes it possible to restrain the wiring material from diffusing to the insulation film 28 which is formed in a manner of covering the bank B and the diffusion preventing film 77. Namely, it is possible to restrain the performance deterioration of the TFT 30 resulting from the diffusion of the wiring material onto the insulation film 28.
3. In the second half-etching step, by subjecting the bank B to half-etching, the bank B's thickness may be made approximately the same as a total sum of the thicknesses of the circuit wiring film 33, the diffusion preventing film 77, and the lyophilic film 71. As a result, it is possible to restrain the step between the bank B and the diffusion preventing film 77 from becoming larger. This makes it possible to restrain the insulation film 28, to be formed on the bank B and the circuit wiring film 33 (gate wiring 12), from getting thin at the step portion.

Hence, it is possible to restrain the diffusion preventing film 77, to be formed on the gate wiring 12 and the gate electrode 11, from generating a short-circuit and the like resulting from the thinning of the insulation film 28, when the diffusion preventing film 77 comes in contact with the source wiring 16 and other thin film layers, which are separated by the insulation film 28.
4. In the second half-etching step, by subjecting the bank B to half-etching, the bank B's thickness may be made approximately the same as the total sum of the thicknesses of the circuit wiring film 33, the diffusion preventing film 77, and the lyophilic film 71. At this time, nickel which is the material of the diffusion preventing film 77 bulging out onto the bank can be removed.

Namely, since nickel positioned at the border of the bank B and the diffusion preventing film 77, which has a relatively high possibility that the insulation film 28 to be formed on the bank B and the diffusion preventing film 77 (gate wiring 12) becomes thin, is removed, it is possible to further restrain the circuit wiring film 33 from generating a short-circuit and the like resulting from the thinning of the insulation film 28, when the diffusion preventing film 77 comes in contact with the source wiring 16 and other thin film layers, which are separated by the insulation film 28.
5. Since it is possible to restrain the diffusion preventing film 77 from generating a short-circuit and the like resulting from the thinning of the insulation film 28, when the diffusion preventing film 77 comes in contact with the source wiring 16 and other thin film layers, which are separated by the insulation film 28, there is little possibility that a defect such as a short-circuit occurs, hence, a TFT 30 of high reliability can be realized.

Third Embodiment

Next, a liquid crystal display which is an example of an electro-optical device according to the invention will be described. The liquid crystal display of the embodiment is a liquid crystal display equipped with a TFT having a wiring pattern formed by using the wiring pattern forming method which was described in the first embodiment and the second embodiment.

Figure 13:
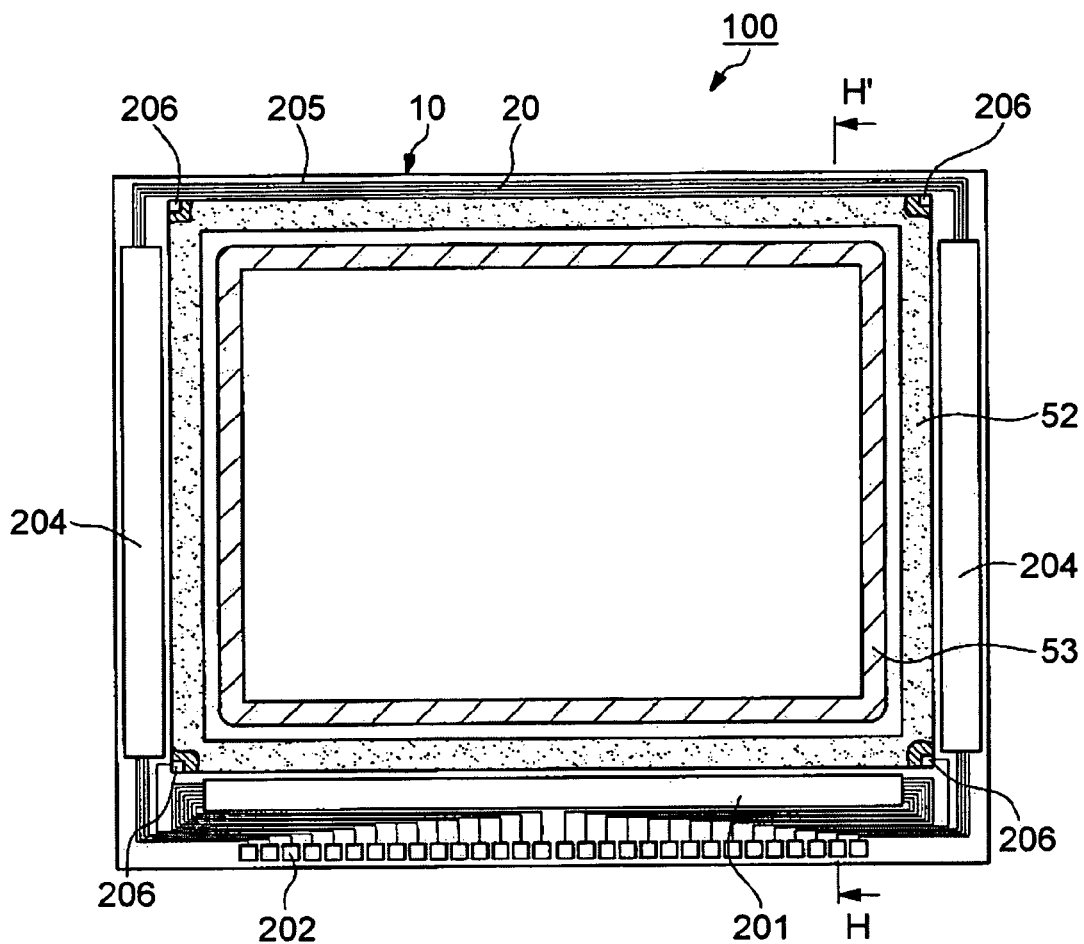
FIG. 13 is a plan view as seen from a side of an opposite substrate of a liquid crystal display of a third embodiment.
Figure 14:
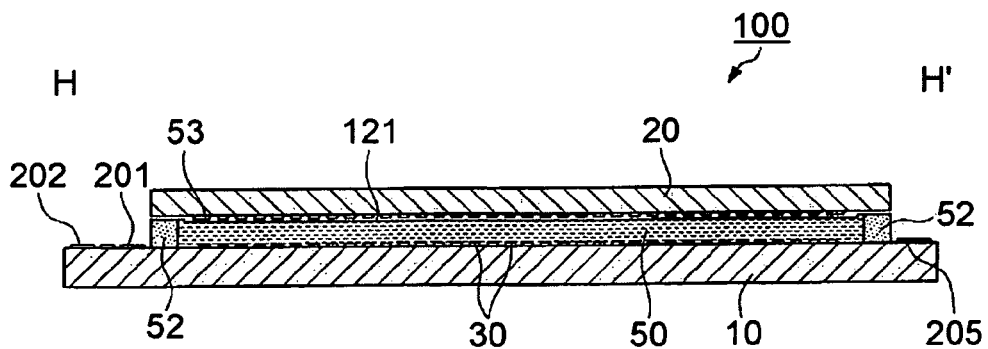
FIG. 14 is a section along line H-H' of FIG. 13.
Figure 15:
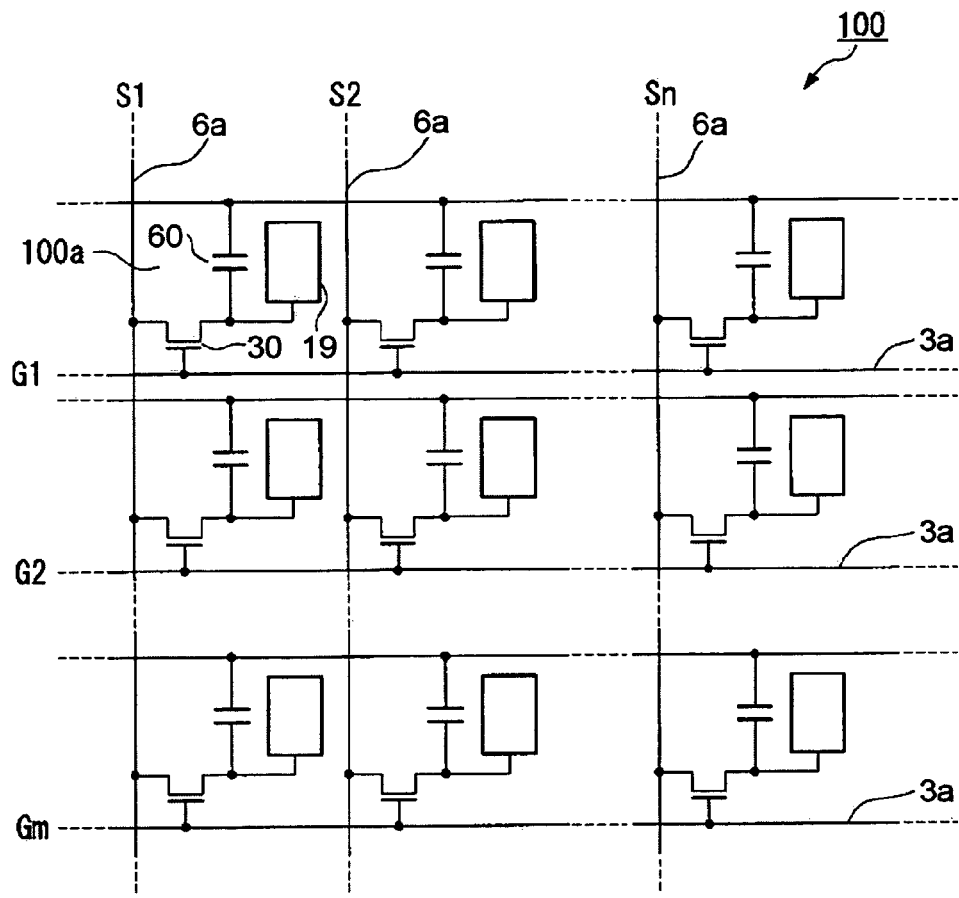
FIG. 15 is an equivalent circuit diagram of a liquid crystal display.
Figure 16:
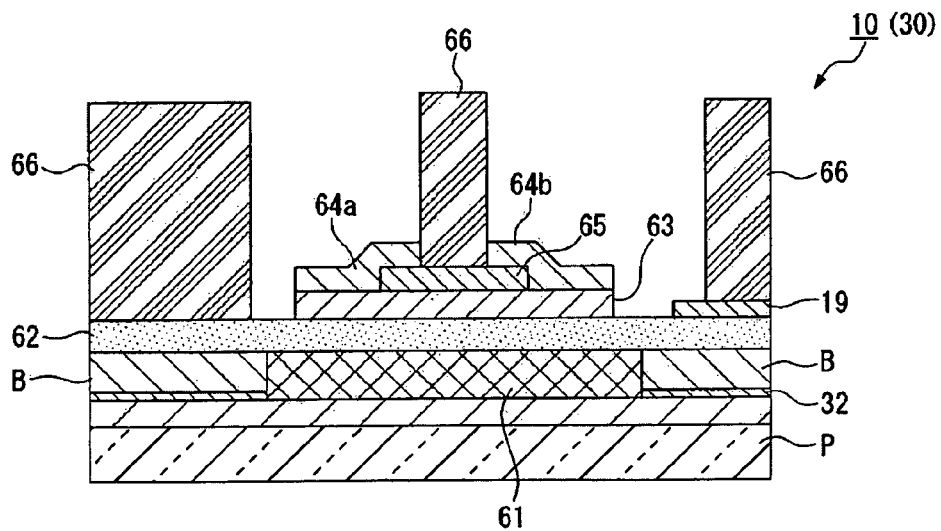
FIG. 16 is a partially enlarged section of the liquid crystal display.

FIG. 13 is a plan view of a liquid crystal display according to the embodiment showing with each constituent element as seen from a side of an opposite substrate, and FIG. 14 is a section along line H-H' of FIG. 13. FIG. 15 is an equivalent circuit diagram of each device, wiring and the like in a plurality of pixels formed in matrix in an image display area of the liquid crystal display, and FIG. 16 is a partially enlarged section of the liquid crystal display.

Note that in each diagram used for description below, since each layer and each member are to be large enough to be recognizable, a reduced scale is different for each layer and each member.

In FIGS. 13 and 14, a liquid crystal display (electro-optical device) 100 is such that a pair of a TFT array substrate 10 and an opposite substrate 20 are glued together with a sealant 52 which is an optical hardening sealant, and that a liquid crystal 50 is sealed and held in an area partitioned by this sealant 52. The sealant 52 is formed in an enclosed frame in the area inside the substrate surface.

In an inside area of the forming area of the sealant 52, there is formed a peripheral partition 53 made up of a light shielding material. On an area outside the sealant 52, there are formed a data line drive circuit 201 and mounted terminals 202 along one side of the TFT array substrate 10. Along two sides adjacent to this side, there is formed a scanning line drive circuit 204. At a remaining side of the TFT array substrate 10, there are formed a plurality of wiring 205 to connect between scanning line drive circuits 204 installed on both sides of the image display area.

Further, in at least one part of a corner section of the opposite substrate 20, there is disposed a continuity material 206 between substrates to provide electrical continuity between the TFT array substrate 10 and the opposite substrate 20.

It should be noted that instead of forming a data line drive circuit 201 and a scanning line drive circuit 204 on the TFT array substrate 10, for example, electrical and mechanical connections may be made between a TAB (Tape Automated Bonding) substrate mounted with an LSI for drive, and a group of terminals formed in the periphery of the TFT array substrate 10 through an anisotropic conductive film.

It should be noted that in the liquid crystal display 100, depending on the kind of liquid crystal 50 to be used, that is, operating mode such as TN (Twisted Nematic) mode and STN (Super Twisted Nematic) mode and normally white mode/normally black mode, there are arranged a phase difference plate, polarization plate and the like are arranged in a preset direction, but illustrations are omitted hereby.

Further, when constituting the liquid crystal display 100 for a color display, in the opposite substrate 20, in an area opposite to each image electrode which is to be explained later, of the TFT array substrate 10, for example, red (R), green (G), and blue (B) color filters are formed, together with its protective film.

In the image display area of the liquid crystal display 100 having such a structure, as shown in FIG. 15, a plurality of pixels 100a are constituted in matrix, while, at the same time, in each of the pixels 100a, a TFT (switching element) 30 for pixel switching is formed, and data lines 6a supplying pixel signals S1, S2 . . . Sn are electrically connected to TFT 30 sources. Pixel signals S1, S2 . . . Sn to be written in the data lines 6a may be supplied in this order of line sequence, and may be supplied per group with respect to the plurality of the data lines 6a which are mutually adjacent.

Further, scanning lines 3a are electrically connected to TFT 30 gates, whereas, at a preset timing, it is constituted such as to impress scanning signals G1, G2 . . . Gm on the scanning lines 3a in pulse in this order of line sequence.

The pixel electrodes 19 are electrically connected to a drain of the TFT 30, and by turning on the TFT 30, which is a switching element, only for a preset period, writes pixel signals S1, S2 . . . Sn supplied from the data lines 6a in each pixel at a preset timing. In this manner, the pixel signals S1, S2 . . . Sn at the preset level which are written in liquid crystals through the pixel electrodes 19 are held for a preset period of time between the pixel electrodes and the opposite electrodes 121 of the opposite substrate 20 shown in FIG. 14.

It should be noted that to prevent the held pixel signals S1, S2 . . . Sn from leaking, in parallel to a liquid crystal capacity formed between the pixel electrodes 19 and the opposite electrodes 121, an accumulation capacity 60 is added. For example, a voltage of the pixel electrodes 19 is held in the accumulation capacity 60 for a period of time longer by three digits than the period of time a source voltage is impressed. This enables a holding characteristic of charges to be improved and the liquid crystal display 100 having a higher contrast ratio to be realized.

FIG. 16 is a partially enlarged section of the liquid crystal display 100 having a TFT 30 of a bottom gate type. On the glass substrate P constituting the TFT array substrate 10, there is formed, according to the forming method of a circuit wiring of the above-reference embodiment, a gate wiring 61 is formed between the banks B on the glass substrate P.

On the gate wiring 61, a semiconductor layer 63 made up of an amorphous silicon (a-Si) layer is layered over through a gate insulation film 62 consisting of SiNx. Part of the semiconductor layer 63 opposite to this gate wiring part is a channel area. On the semiconductor layer 63, for example, junction layers 64a and 64b consisting of an n+type a-Si layer to obtain an ohmic junction are layered over, whereas on the semiconductor layer 63 at the center of the channel area, there is formed an insulating etch stop layer 65 made up of SiNx to protect the channel.

It should be noted that these gate insulating film 62, semiconductor layer 63, and an etch stop film 65 are subjected to patterning as illustrated by undergoing photoresist coating, exposure, development, and photo etching after chemical vapor deposition (CVD).

Further, the pixel electrode 19 made up of junction layers 64a, 64b and an ITO (Indium Tin Oxide) is likewise subjected to film-making, and by being subjected to photo-etching, it is patterned as illustrated. And the banks 66 are respectively set up protrudingly on the pixel electrode 19, the gate insulation film 62, and the etch stop film 65, and it is possible to form a source line and a drain line by using the above-referenced liquid droplet ejection device IJ between these banks 66 and ejecting liquid droplets of a silver compound.

It should be noted that in the above-referenced embodiment, a configuration is such as to use the TFT 30 as a switching element for driving the liquid crystal display 100. However, other than the liquid crystal display, it is applicable, for example, to an organic EL (Electroluminescence) display device.

The organic EL display device is configured such that a thin film including fluorescent, inorganic and organic compounds is grasped by cathode and anode. By injecting an electron and a hole into the above-referenced thin film to bring about recombination, an exciton is generated, and in this element, a discharge of light (fluorescence and phosphorescence) as this exciton is inactivated is utilized to emit light.

And, of the fluorescent materials used for organic EL display elements, materials presenting each light-emitting color of red, green, and blue, namely, light-emitting layer forming materials and materials forming a hole injection/electron transport layer are used as inks. And by subjecting them respectively to patterning on the substrate having the above-referenced TFT 30, it is made possible to manufacture a self-light emitting, full color EL device. Such organic EL device is included in a range of devices (electro-optical devices) in the invention.

As other embodiments, an embodiment of a non-contact type card medium will be described.

Figure 17:
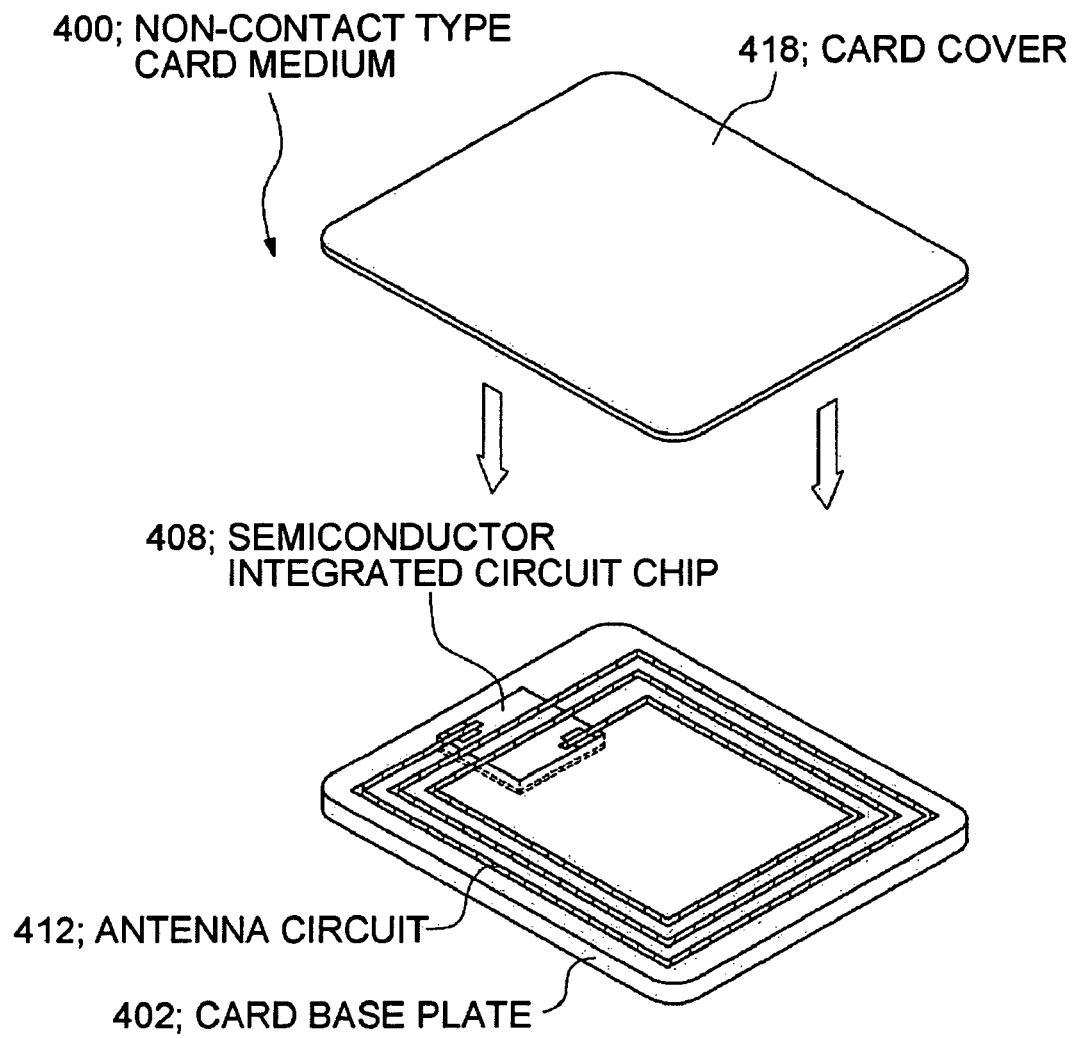
FIG. 17 is an exploded perspective of a non-contact type card medium.

As shown in FIG. 17, a non-contact type card medium (electronic equipment) 400 according to the embodiment has a semiconductor integrated circuit chip 408 and an antenna circuit 412 built in a frame made up of a card substrate 402 and a card cover 418, being adapted such as to perform at least one of receiving supply of power or sending and receiving data by means of at least one of an un-illustrated external transmitter and receiver and electromagnetic wave or electrostatic capacity combination.

In the embodiment, the above-referenced antenna circuit 412 is formed by the wiring pattern forming method according to the above-referenced embodiment.

It should be added that as a device (electro-optical device) according to the invention, in addition to the above, it is applicable to a PDP (Plasma Display Panel), a surface conductive type electron discharge element and the like using a phenomenon generating an electron discharge by running a current parallel to the surface of a small-area thin film formed on the substrate.

According to this embodiment, the following advantageous effect is obtained.

1. It is possible to restrain the wiring pattern to generate a short-circuit and the like when it comes in contact with the source wiring 16 and other thin film layers which are separated by the insulation film 28, hence, there is little possibility of generating a defect such as a short-circuit. Therefore, the liquid crystal display 100 of high reliability can be realized.

Fourth Embodiment

Next, electronic equipment according to the invention will be described. A liquid crystal display of electronic equipment of the embodiment is electronic equipment provided with the liquid crystal display described in the third embodiment. Specific examples of the electronic equipment of the embodiment will be described.

Figure 18A:
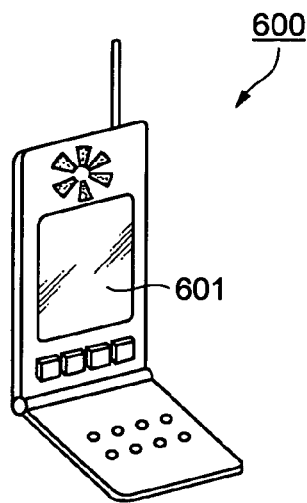
FIG. 18 is an external view showing specific examples of electronic equipment.

FIG. 18A is a perspective showing an example of a mobile phone. In FIG. 18A, 600 shows a mobile phone body, and 601 shows a liquid crystal display section provided with a liquid display 100 of the above-referenced embodiment.

Figure 18B:
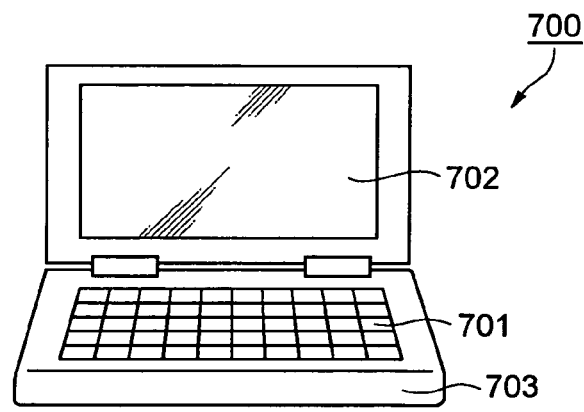

FIG. 18B is a perspective showing an example of a portable information processing device such as a word processor and a personal computer. In FIG. 18B, 700 shows a body of the portable information processing device, 701 shows an input section such as a keyboard, 703 is an information processing body, and 702 shows a liquid crystal display section provided with the liquid crystal display 100 of the above-referenced embodiment.

Figure 18C:
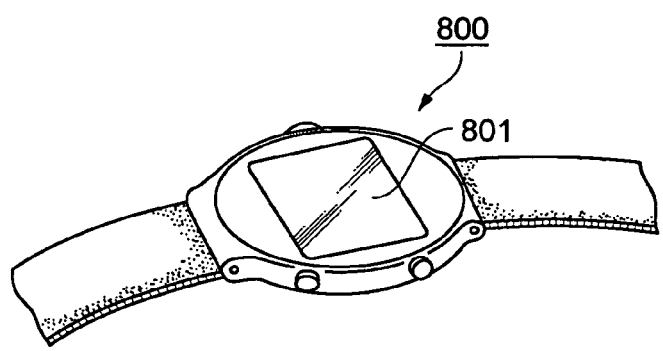

FIG. 18C is a perspective showing an example of electronic equipment of a wrist watch type. In FIG. 18C, 800 shows a watch body, and 801 shows a liquid crystal display section provided with a liquid display 100 of the above-referenced embodiment.

Electronic equipment shown in FIG. 18A through 18C is provided with the liquid crystal display of the above-referenced embodiment which has a wiring pattern with a small step between the bank and the circuit wiring film, a small bulge of the circuit wiring film onto the bank, and a small residue of the conductive material on the bank in the periphery.

It should be noted that the electronic equipment of the embodiment is equipped with liquid crystal equipment. It is also possible to make it the electronic equipment provided with other electro-chemical equipment such as an organic electroluminescence display and a plasma type display.

According to this embodiment, the following advantageous effect is obtained.

1. Since there is little possibility of generating a defect such as a short-circuit, it is possible to realize a mobile phone 600 having high reliability, an information processing device 700, and a watch 800, which have little possibility of generating a defect such as a short-circuit resulting from provision of the liquid crystal display 100 of high reliability.

While preferred embodiments according to the invention have been described with reference to appended drawings, it goes without saying that the invention is not limited thereto. Various shapes, combinations and the like of each constituting member shown in the above-referenced examples are an example but may be variously changed and modified based on design requirements and other factors within the spirit and scope of the invention. The invention may be practiced as follows.

Variation Example 1

In the above-referenced embodiment, after the bank is formed, lyophilic processing of the concavity between the banks is carried out. However, lyophilic processing is not essential. In the case where surfaces of the substrate and the bank forming the concavity have sufficient lyophilic property, such processing may be omitted.

Variation Example 2

In the above-reference embodiment, in the first half-etching step conducted prior to the third functional liquid arrangement step to form the diffusion preventing film, the bank B and the circuit wiring film 73 are subjected to half-etching. However, it is not essential to subject both the bank B and the circuit wiring film 73 to half-etching. It may be such that the height of the bank B is made sufficiently high with respect to the thickness of the circuit wiring film 73, so that the half-etching of the circuit wiring film 73 may be omitted.

When omitting the half-etching of the circuit wiring film 73, by raising the height of the bank B sufficiently high with respect to the thickness of the circuit wiring film 73, the step between the upper surface of the bank B and the upper surface of the circuit wiring film 73 is made larger so that it is made difficult for the bulge 74, which is linked to the circuit wiring film 73 and bulges onto the bank B, to be formed.

Variation Example 3

In the above-reference embodiment, in the first half-etching step conducted prior to the third functional liquid arrangement step to form the diffusion preventing film, the bank B and the circuit wiring film 73 are subjected to half-etching. However, it is not essential to subject both the bank B and the circuit wiring film 73 to half-etching. The half-etching of the bank B may be omitted.

When omitting the half-etching of the bank B, at the time of half-etching the circuit wiring film 73, by treating the surface of the bank B concurrently, the bulge 74, which bulged out onto the bank B, and the residue 76 of the wiring material left on the bank B are removed.

Variation Example 4

In the above-reference embodiment, after forming the diffusion preventing film 77, the second half-etching step is conducted. However, it is not essential to carry out the second half-etching. In the first half-etching step, by carrying out the half-etching such that the step between the bank B and the circuit wiring film 73 becomes approximately the same as the thickness of the diffusion preventing film 77, the second half-etching of the bank B may be omitted.

In this case, the residue of the material forming the diffusion preventing film 77 remains on the bank B and the bulge of the diffusion preventing film 77 is formed on the bank B. Nevertheless, since the material forming the diffusion preventing film 77 has very little possibility of diffusing to the thin film covering the circuit wiring and the bank B, there is very little possibility of the performance of the thin film covering the circuit wiring and the bank B to deteriorate.

Variation Example 5

In the above-referenced embodiment, while an example of forming the gate wiring 12, the gate electrode 11 and the like by using the forming method of a circuit wiring of the invention was described, the source wiring 16 and the source electrode 17 may be formed by using the forming method of a circuit wiring of the invention. In the case of forming the source wiring 16 and the source electrode 17, the same effect as the case of forming the gate wiring 12 and the gate electrode 11 can be achieved.

Variation Example 6

Further, in the above-referenced embodiment, the conductive film was formed on the concavity shaped between the banks B to form the wiring pattern. It is not limited to this but can be applied to forming a variety of film patterns. For example, it is applicable to a color filter used for making displayed images in color in the liquid crystal display.

This color filter can be formed by arranging a preset pattern with the ink (liquid material) of R (red), G(green), and B (blue) as liquid droplets with respect to the substrate, and by arranging the ink onto the bank and forming the color filter, it is possible to manufacture a liquid crystal display having the color filter.

After forming the color filter, the bank is half-etched to make the color filter and the bank approximately level, so that a cathode film to be formed on the color filter and the bank can be formed more easily. Further, a cathode film which is approximately level in uniform thickness can be formed.

What is claimed is:

1. A wiring pattern forming method which is a method of forming a wiring pattern by using a liquid droplet ejection method on a preset area on a substrate, comprising:
   forming a bank on the preset area on the substrate;
   ejecting a functional liquid including a wiring pattern material on an area surrounded by the bank and drying the functional liquid to form the wiring pattern; and
   removing part of the bank so as to make a height of the bank and a thickness of the wiring pattern approximately the same.

2. The wiring pattern forming method according to claim 1, wherein the method of removing part of the bank is carried out in half-etching.

3. The wiring pattern forming method according to claim 1, wherein a material forming the bank is an inorganic resin.

4. The wiring pattern forming method which is the method of forming a wiring pattern by using the liquid droplet ejection method on the preset area on the substrate, comprising:
   forming a bank in a manner of surrounding the preset area on the substrate;
   ejecting a first functional liquid on the area surrounded by the bank and drying the first functional liquid to form a first wiring pattern;
   ejecting a second functional liquid on the first wiring pattern and drying the second functional liquid to form a second wiring pattern; and
   removing part of the bank so that the height of the bank and the thickness of the wiring pattern, in which the first wiring pattern and the second wiring pattern are layered over, may become approximately the same.

5. The wiring pattern forming method which is the method of forming a wiring pattern by using the liquid droplet ejection method on the preset area on the substrate, comprising:
   forming a bank in a manner of surrounding the preset area on the substrate;
   ejecting a first functional liquid on the area surrounded by the bank and drying the first functional liquid to form a first wiring pattern;
   removing part of the bank and part of the first wiring pattern so that the thickness of the bank may become thicker than the thickness of the first wiring pattern; and
   removing part of the bank so that the height of the bank and the thickness of the wiring pattern, in which the first wiring pattern and the diffusion prevention layer are layered over, may become approximately the same.

6. The wiring pattern forming method which is the method of forming a wiring pattern by using the liquid droplet ejection method on the preset area on the substrate, comprising:
   forming a bank in a manner of surrounding the preset area on the substrate;
   ejecting a first functional liquid including a material of a first wiring pattern on the area surrounded by the bank and drying the first functional liquid to form the first wiring pattern;
   removing part of the bank and part of the first wiring pattern so that the thickness of the bank may become thicker than the thickness of the first wiring pattern after forming the first wiring pattern a plurality of times;
   forming a diffusion prevention layer to prevent a material from diffusing onto the first wiring pattern; and
   removing part of the bank so that the height of the bank and the thickness of the wiring pattern, in which the first wiring pattern and the diffusion prevention layer are layered over, may become approximately the same.

7. A semiconductor device, wherein a wiring pattern is formed using a wiring pattern according to claim 1.

8. An electro-optical device, having a semiconductor device according to claim 7.

9. Electronic equipment, having the electro-optical device according to claim 8.

10. The film pattern forming method which is the method of forming a film pattern by using the liquid droplet ejection method on the preset area on the substrate, comprising:
    forming a bank in a manner of surrounding the preset area on the substrate;
    ejecting a first functional liquid on the area surrounded by the bank and drying the first functional liquid to form a first film pattern;
    ejecting a second functional liquid on the first film pattern and drying the second functional liquid to form a second film pattern; and
    removing part of the bank so that the height of the bank and the thickness of the film pattern, in which the first film pattern and the second film pattern are layered over, become approximately the same.

* * * * *

UNITED STATES PATENT AND TRADEMARK OFFICE
CERTIFICATE OF CORRECTION

PATENT NO. : 7,622,385 B2  Page 1 of 1
APPLICATION NO. : 11/242009
DATED : November 24, 2009
INVENTOR(S) : Moriya et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 747 days.

Signed and Sealed this

Twenty-sixth Day of October, 2010

David J. Kappos
*Director of the United States Patent and Trademark Office*